(12) United States Patent
Pellizzer

(10) Patent No.: US 11,133,062 B1
(45) Date of Patent: Sep. 28, 2021

(54) TWO MEMORY CELLS SENSED TO DETERMINE ONE DATA VALUE

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/869,059

(22) Filed: May 7, 2020

(51) Int. Cl.
  *G11C 11/00* (2006.01)
  *G11C 13/00* (2006.01)

(52) U.S. Cl.
  CPC ........ *G11C 13/004* (2013.01); *G11C 13/0004* (2013.01); *G11C 13/0064* (2013.01); *G11C 13/0069* (2013.01); *G11C 2013/005* (2013.01); *G11C 2013/009* (2013.01); *G11C 2013/0057* (2013.01); *G11C 2213/15* (2013.01)

(58) Field of Classification Search
  CPC .............. G11C 13/004; G11C 13/0004; G11C 13/0069; G11C 13/0064; G11C 2013/005; G11C 2013/0057; G11C 2013/009; G11C 2213/15
  USPC ........................................................ 365/148
  See application file for complete search history.

(56) References Cited

U.S. PATENT DOCUMENTS

| | | | | |
|---|---|---|---|---|
| 7,411,820 | B2 * | 8/2008 | Mo ..................... | G11C 11/5642 365/185.03 |
| 9,058,874 | B2 * | 6/2015 | Choi .................. | G11C 13/0009 |
| 9,117,519 | B2 | 8/2015 | Spessot et al. | |
| 9,613,695 | B2 | 4/2017 | Spessot et al. | |
| 10,395,738 | B2 | 5/2019 | Castro | |
| 10,366,747 | B2 | 7/2019 | Castro | |
| 10,381,075 | B2 | 8/2019 | Totorelli et al. | |
| 10,546,632 | B2 | 1/2020 | Redaelli et al. | |
| 10,803,939 | B2 * | 10/2020 | Castro ................ | G11C 13/0069 |

* cited by examiner

*Primary Examiner* — Tha-O H Bui
(74) *Attorney, Agent, or Firm* — Brooks, Cameron & Huebsch, PLLC

(57) ABSTRACT

Apparatuses, methods, and systems for sensing two memory cells to determine one data value are described herein. An embodiment includes a memory having a plurality of memory cells and circuitry configured to sense memory states of each of two memory cells to determine one data value. One data value is determined by sensing the memory state of a first one of the two memory cells using a first sensing voltage in a sense window between a first threshold voltage distribution corresponding to a first memory state and a second threshold voltage distribution corresponding to a second memory state and sensing the memory state of a second one of the two memory cells using a second sensing voltage in the sense window. The first and second sensing voltages are selectably closer in the sense window to the first threshold voltage distribution or the second threshold voltage distribution.

25 Claims, 8 Drawing Sheets

… (1)

TWO MEMORY CELLS SENSED TO DETERMINE ONE DATA VALUE

TECHNICAL FIELD

The present disclosure relates generally to semiconductor memory and methods, and more particularly, to two memory cells sensed to determine one data value.

BACKGROUND

Memory devices are typically provided as internal, semiconductor, integrated circuits and/or external removable devices in computers or other electronic devices. There are many different types of memory, including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and/or low power consumption. Non-volatile memory may be used in, for example, personal computers, portable memory sticks, solid state drives (SSDs), digital cameras, cellular telephones, portable music players, such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target memory state by varying the resistance level of the memory element. Resistance variable memory cells can be programmed to a target memory state (e.g., corresponding to a particular resistance state) by applying sources of an electrical field or energy, such as positive or negative electrical pulses (e.g., positive or negative voltage or current pulses) to the memory cells (e.g., to the memory element of the memory cells) for a particular duration. A state of a resistance variable memory cell can be determined by sensing current through the memory cell responsive to an applied interrogation voltage. The sensed current, which varies based on the resistance level of the memory cell, can indicate the state of the memory cell.

Various memory arrays can be organized in a cross-point architecture with memory cells (e.g., resistance variable memory cells) being located at intersections of a first and second signal lines used to access the memory cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can include a single material which can serve as both a select element and a storage element for the memory cell.

DETAILED DESCRIPTION

Figure 1:
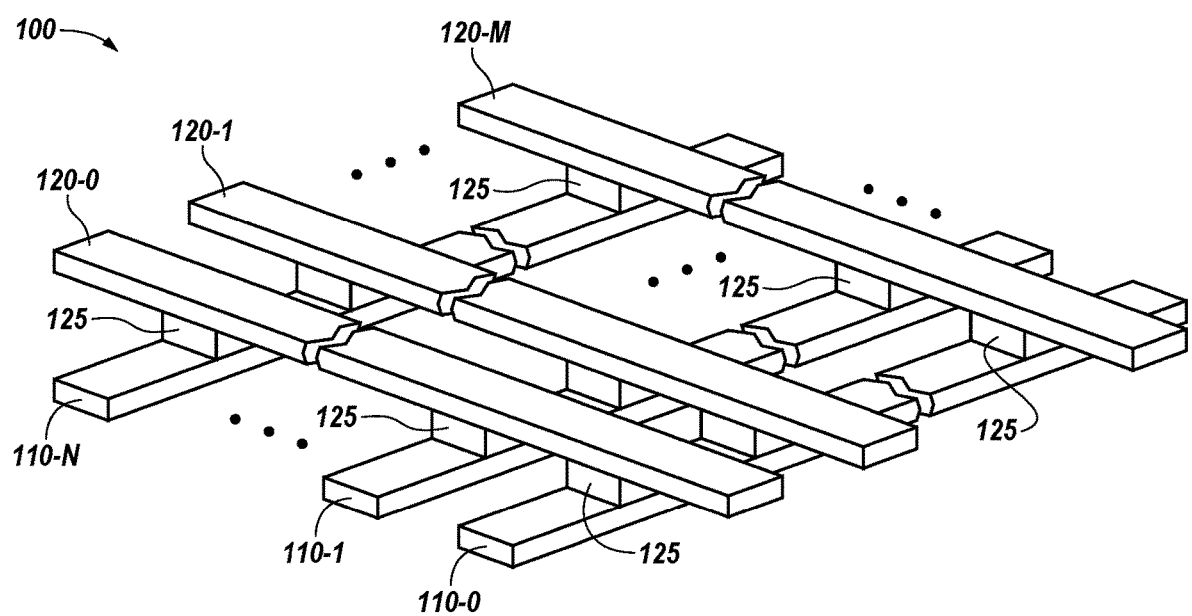
FIG. 1 is a three-dimensional view of an example of a memory array, in accordance with an embodiment of the present disclosure.

The present disclosure includes apparatuses, methods, and systems for sensing two memory cells to determine one data value. An embodiment includes a memory having a plurality of memory cells and circuitry configured to sense memory states of each of two memory cells of the plurality to determine one data value. The one data value is determined by sensing the memory state of a first one of the two memory cells using a first sensing voltage in a sense window between a first threshold voltage distribution corresponding to a first memory state and a second threshold voltage distribution corresponding to a second memory state and sensing a memory state of a second one of the two memory cells using a second sensing voltage in the sense window. The first sensing voltage and the second sensing voltage are selectably closer in the sense window to the first threshold voltage distribution or the second threshold voltage distribution.

Embodiments of the present disclosure can provide benefits, such as increased reliability and accuracy of data sensing and/or increased speed and reduced complexity of data correction operations, as compared to previous memory devices. For example, previous approaches for programming resistance variable memory cells, such as self-selecting memory cells, may generate one of two different states, such that each of the memory cells can be programmed to one of two possible memory states (e.g., state 0 or state 1). In such approaches, a single sensing voltage may be placed substantially at a median voltage separation in a sense (e.g., read) window between a first threshold voltage distribution corresponding to a first memory state (e.g., state 0) and a second threshold voltage distribution (e.g., a distribution of stored voltages for a second number of memory cells) corresponding to a second memory state (e.g., state 1). Each of the first and second threshold voltage distributions may represent separate distributions of stored voltages for a plurality of memory cells and/or a statistical distribution of potential stored voltages for a first memory cell and a paired second memory cell.

A number of data storage and/or programming considerations for various types of memory cells (e.g., resistance variable memory cells, among others), however, may cause stored voltages of a number (e.g., a subset or all) of the memory cells in the first and/or second threshold voltage distributions to shift and to overlap the single sensing voltage at the median of the sense window such that the sensed voltage relative to the sensing voltage (e.g., the data value) becomes unreliable and/or inaccurate during read operations. Such shifts may, for example, be contributed to by (e.g., result from) at least one of a widening (e.g., over time) of the first and/or second threshold voltage distributions to at least overlap the single sensing voltage, a drift (e.g., over time) of the first and/or second threshold voltage distributions to a larger median voltage to at least overlap the single sensing voltage, and/or a disturbance of memory states of subsets of memory cells in the first and/or second threshold voltage distributions, by performance of read and/or write operations on at least some of the memory cells, to at least overlap the single sensing voltage, among other possible data storage and/or programming considerations.

The embodiments described herein for sensing two memory cells to determine one data value by using a first sensing voltage and a second sensing voltage that are selectably closer in the sense window to the first threshold voltage distribution or the second threshold voltage distribution are intended to reduce a potential for some of the stored voltages overlapping the sensing voltages of the respective threshold voltage distributions. As such, these embodiments can increase the reliability and accuracy of data accessed from memory cells. Moreover, as described herein, the embodiments can increase speed and/or reduce complexity of data correction operations for potential data errors that may result, for example, from such shifts in the first and/or second threshold voltage distributions to further increase the reliability and accuracy of the data accessed from memory cells, as compared to previous memory devices. Memory devices may include a plurality of arrays of memory cells of which all of the arrays or a subset (less than all) of the arrays may be configured to store, read, write, and/or perform data validation and correction as described herein.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure. Moreover, numbers separated by a hyphen from a particular reference numeral (e.g., 212-1, 212-2, . . . , 212-6 in FIGS. 2A and 2D-2G for sense windows) are intended to denote similar features, although the position, magnitude, width, height, and/or shape, etc., of such features may vary within and/or between particular embodiments. The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality second signal lines (e.g., second access lines), which may be referred to as bit lines 120-0 to 120-M that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different memory states. In some examples, each of memory cells 125 may include a single material that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed from various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), and/or a quaternary composition that may include elements selected from tellurium (Te), sulfur (S), carbon (C), nitrogen (N), silicon (Si), Se, As, and Ge, etc., among other elements selected from corresponding groups of the periodic table.

In various embodiments, at the threshold voltage the memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The example shown in FIG. 1 may include a driver (e.g., a word line driver—not shown) coupled to word line 110. The word line driver may supply bi-polar (e.g., positive and negative) current and/or voltage signals to word line 110. A sense amplifier (e.g., in the sensing circuitry 305 shown in FIG. 3), which may comprise a cross-coupled latch, may be coupled to the word line driver and may detect positive and negative currents and/or positive and negative voltages on word line 110. In some examples, a sense amplifier may be part of (e.g., included in) a word line driver. For example, the word line driver may include the sensing functionality of sense amplifier. In some examples, a sense amplifier may be part of (e.g., included in) the sensing circuitry coupled to the memory cells 125 (e.g., in an array of memory cells, as shown at 306 in FIG. 3). A bit line driver (not shown) may be coupled to bit line 120 to supply positive and/or negative current and/or voltage signals to bit line 120.

The sense amplifier may detect the current and/or voltage associated with one or more memory cells 125 relative to a particular sensing voltage (e.g., threshold) and may output a signal to indicate a particular memory state of each memory cell 125 based on a magnitude of a voltage stored by a particular memory cells relative to the particular sensing voltage. The sensed memory state for each memory cell 125 may be sent to and/or stored by a particular latch (not shown) as expressed in a truth table (e.g., as shown in tables 213 and described in connection with FIGS. 2A and 2D-2G), and the sensed memory states value may represent a particular determined outcome of verification of validity of the sensed memory states and/or the need for correction of invalid sensed memory states (e.g., associated with a read operation).

Figure 2A:
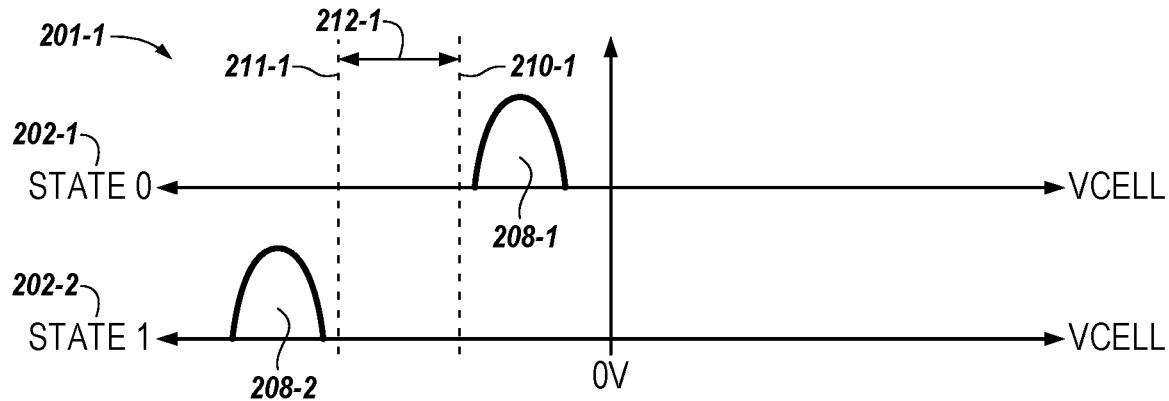
FIG. 2A illustrates an example of sensing threshold voltage distributions associated with memory states of memory cells for two memory cells being sensed to determine one data value, in accordance with an embodiment of the present disclosure.
Figure 2A:
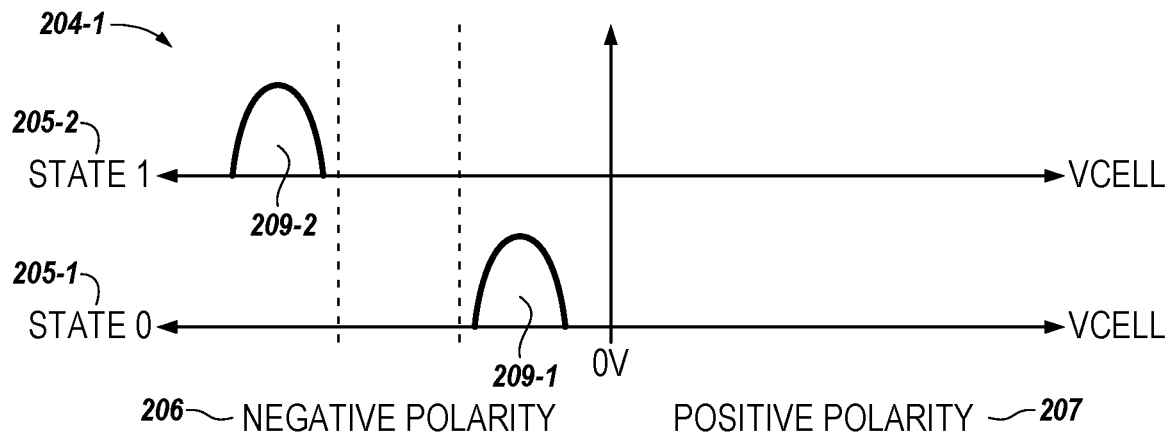

FIG. 2A illustrates an example of sensing threshold voltage distributions associated with memory states of memory cells for two memory cells being sensed to determine one data value, in accordance with an embodiment of the present disclosure. FIG. 2A illustrates threshold voltage distributions, and a truth table associated with various memory states of memory cells, such as memory cells 125 illustrated in FIG. 1.

The example shown in FIG. 2A illustrates threshold voltage distributions 208-1 and 208-2, and 209-1 and 209-2, associated with the memory states of two memory cells 201-1 and 204-1, respectively, that may operate as a pair of memory cells to each store a voltage magnitude that, when sensed and compared, enable determination of one (a single) data value. Each of the memory cells 201-1, 204-1 shown represents one of a plurality of such memory cells, where each of the memory cells is configured to selectably store a voltage magnitude (e.g., relative to zero volts (0V)) corresponding to one of two memory states as determined by reference to a determined (e.g., predetermined) sensing voltage in a sense window 212-1 between two threshold voltage distributions that, when not shifted relative to (e.g., at least overlapping) one or both of their determined sensing voltages, each corresponds to one of the two memory states.

First memory cell 201-1 may have a first memory state 202-1 (e.g., a memory state of 0) and a second memory state 202-2 (e.g., a memory state of 1) in a negative polarity 206. Similarly, second memory cell 204-1 also may have a first memory state 205-1 (e.g., a memory state of 0) and a second memory state 205-2 (e.g., a memory state of 1) in the negative polarity 206. For example, second memory cell 204-1 may store its memory state as an intended data value corresponding to the one data value and second memory cell 204-1 may be programmed by applying a first number of voltage pulses to the memory cell. First memory cell 201-1 may store its memory state as a reference data value corresponding to the intended data value and first memory cell 201-1 may be programmed by applying a second voltage pulse to the memory cell. For example, when second memory cell 204-1 stores an intended memory state 205-2 of 1 and first memory cell 201-1 stores a complementary reference memory state 202-1 of 0 (e.g., in binary memory states), the resultant one data value is determined to be 1. Alternatively, when second memory cell 204-1 stores an intended memory state 205-1 of 0 and first memory cell 201-1 stores a complementary reference memory state 202-2 of 1, the resultant one data value is determined to be 0. As described further herein, the memory cells 201-1, 204-1 may alternatively be programmed in a positive polarity 207.

The terms "reference" and "intended" are used herein to more easily distinguish from each other paired memory cells (e.g., a first memory cell 201-1 and second memory cell 204-1), associated memory states, and corresponding data values. However, the intent of the present disclosure is to output one data value as a "reliable state" from sensing two memory cells and not necessarily by designating one memory cell, associate memory state, and/or corresponding data value as "reference" and the other as "intended."

The magnitude and/or number of the voltage pulses may differ in the programming of the intended data value versus the reference data value. For example, as shown in FIG. 2A, when second memory cell 204-1 is programmed to an intended data value of 1 in memory state 205-2, corresponding to threshold voltage distribution 209-2, first memory cell 201-1 is programmed to a complementary reference data value of 0 in memory state 202-1, corresponding to threshold voltage distribution 208-1. As shown in the negative polarity 206, memory state 202-2 for the reference memory cell 201-1 and memory state 205-2 for the intended memory cell 204-1 (e.g., corresponding to the memory state of 1) are programmed at a greater voltage magnitude (absolute value) in the negative polarity 206 relative to the lesser voltage magnitude for memory state 202-1 for the reference memory cell 201-1 and memory state 205-1 for the intended memory cell 204-1 (e.g., corresponding to the memory state of 0).

Alternatively, when second memory cell 204-1 is programmed to an intended data value of 0 in memory state 205-1, corresponding to threshold voltage distribution 209-1, first memory cell 201-1 is programmed to a complementary reference data value of 1 in memory state 202-2, corresponding to threshold voltage distribution 208-2. Memory state 202-1 for the reference memory cell 201-1 and memory state 205-1 for the intended memory cell 204-1 (e.g., corresponding to the memory state of 0) are programmed at a lesser voltage magnitude in the negative polarity 206 relative to the greater voltage magnitude for memory state 202-2 for the reference memory cell 201-1 and memory state 205-2 for the intended memory cell 204-1 (e.g., corresponding to the memory state of 1). As such, sensed memory states may include a memory state associated with the first threshold voltage distribution of a first subset of the plurality of memory cells whose relative magnitude is greater (e.g., for a particular polarity) than a different one of the two memory states associated with the second threshold voltage distribution of a second subset of the plurality of memory cells. How much greater or lesser the voltage magnitude is may depend on the magnitude and/or number of the voltage pulses used to program the complementary memory states.

In FIG. 2A, a voltage (VCELL) applied to a particular memory cell to program an appropriate stored voltage for a particular memory state may correspond to a voltage differential applied to (e.g., across) the memory cell, such as the difference between a bit line voltage (VBL) and a word line voltage (VWL) (e.g., VCELL=VBL−VWL), as shown and described in connection with FIGS. 2B and 2C. The threshold voltage distributions (e.g., ranges) 208-1, 208-2, 209-1, and 209-2 may represent a statistical variation in the threshold voltages of memory cells programmed to a particular memory state. The threshold voltage distributions illustrated in FIGS. 2A and 2D-2G are illustrated by way of example and the relative sizes, shapes, separations, placements, etc., may differ from actual programming and/or sensing of the respective memory states.

Reliability and/or accuracy of determining the one data value may depend on an ability to distinguish, for example, memory state 205-2, corresponding to threshold voltage distribution 209-2, for intended memory cell 204-1 from memory state 205-1, corresponding to threshold voltage distribution 209-1, for the intended memory cell 204-1. The reliability and/or accuracy may further depend on an ability to distinguish memory state 202-1, corresponding to threshold voltage distribution 208-1, from memory state 202-2, corresponding to threshold voltage distribution 208-2, for the reference memory cell 201-1.

Accordingly, as shown in the embodiment illustrated in FIG. 2A, circuitry (e.g., sensing circuitry 305 and/or control circuitry 324) may be configured to determine the one data value. The one data value may be determined by sensing a memory state (e.g., memory state 202-1 or memory state 202-2) of a first one (e.g., memory cell 201-1) of the two memory cells using a first sensing voltage (e.g., 211-1) in a sense window 212-1 between a first threshold voltage distribution (e.g., 208-1 and/or 209-1) corresponding to a first memory state (e.g., 202-1 and/or 205-1) and a second threshold voltage distribution (e.g., 208-2 or 209-2) corresponding to a second memory state (e.g., 202-2 and/or 205-2) and sensing the memory state (e.g., memory state 205-1 or memory state 205-2) of a second one (e.g., memory cell 204-1) of the two memory cells using a second sensing voltage (e.g., 210-1) in the sense window 212-1. In a number of embodiments illustrated and described in connection with FIGS. 2A and 2D-2G, the first sensing voltage and the second sensing voltage may be selectably closer in the sense window to the first threshold voltage distribution or the second threshold voltage distribution. As presented herein, the two sensing voltages with reference numerals 210 and 211 may be used to determine the memory states of a corresponding pair of memory cells (e.g., to distinguish between memory states as part of a read operation).

In the embodiment shown in FIG. 2A, the first sensing voltage and the second sensing voltage may be selectably closer in the sense window 212-1 to different ones of the first threshold voltage distribution and the second sensing voltage. Hence, sensing voltage 210-1 is shown to be closer to (e.g., while having a statistically appropriate separation margin) the first threshold voltage distribution 208-1 and/or 209-1 and sensing voltage 211-1 is shown to be closer (e.g., while also having a statistically appropriate separation margin), the second threshold voltage distribution 208-2 and/or 209-2.

The circuitry may, in a number of embodiments, be further configured to store the memory state of one memory cell in association with a particular end of the sense window 212-1 having a particular magnitude of a polarity and store the memory state of the other memory cell in association with an opposite end of the sense window having a different magnitude of the polarity (e.g., the polarity may be selectable from the negative polarity 206 and the positive polarity 207, as shown and described in connection with FIGS. 2A and 2D-2G). For example, as shown in FIG. 2A, the memory states 202-1 and 205-1, corresponding to a data value of 0 and a lesser voltage magnitude in the negative polarity of threshold voltage distributions 208-1 and/or 209-1, are stored marginal to one end of the sense window 212-1 determined by sensing voltage 210-1. In contrast, the memory states 202-2 and 205-2, corresponding to a data value of 1 and a greater voltage magnitude in the negative polarity of threshold voltage distributions 208-2 and/or 209-2, are stored marginal to the other end of the sense window 212-1 determined by sensing voltage 211-1.

Accordingly, one end of the sense window 212-1 may correspond to a programmed memory state 202-1 (e.g., having a data value of 0) for a first memory cell 201-1 and another end of the polarity of the sense window may correspond to a complementary reprogrammed memory state 202-2 (e.g., having a data value of 1) for the first memory cell 201-1. Which end of the sense window 212-1 corresponds to the programmed memory state 202-1 and which other end of the sense window corresponds to the complementary reprogrammed memory state 202-2 may be determined by a first number of voltage pulses applied to the first memory cell 201-1 to program the first memory cell to a magnitude less than the first sensing voltage 210-1 in the sense window and a second number, different from the first number, of voltage pulses applied to the first memory cell 201-1 to reprogram the first memory cell to a magnitude greater than the second sensing voltage 211-1 in the sense window.

In addition, one end of the sense window 212-1 may correspond to a programmed memory state 202-1 for the first memory cell 201-1 and another end of the polarity of the sense window may correspond to a complementary reprogrammed memory state 205-2 for a second memory cell 204-1. Which end of the sense window 212-1 corresponds to the programmed memory state 202-1 and which other end of the sense window corresponds to the complementary reprogrammed memory state 205-2 may be determined by a first number of voltage pulses applied to the first memory cell 201-1 to program the first memory cell to a magnitude less than the first sensing voltage 210-1 in the sense window and a second number, different from the first number, of voltage pulses applied to the second memory cell 204-1 to reprogram the second memory cell to a magnitude greater than the second sensing voltage 211-1 in the sense window.

The circuitry may be further configured to determine the one data value by comparing the sensed memory states of each of the two memory cells, validating the memory state of memory cell 204-1 as an intended data value corresponding to the one data value by determining that the sensed memory states are complementary binary memory states (e.g., one memory state being 0 and the other memory state being 1) and determining a switch in the memory state of the two memory cells (e.g., either of memory cells 201-1 or 204-1) by determining that the sensed memory states match binary memory states (e.g., both memory states being 0 or both memory states being 1). A determination of which of the two memory cells has switched from one memory state to another memory state (e.g., from 0 to 1 or from 1 to 0) may be based at least in part on one combination of the two memory states that is complementary in binary memory states being more readably reliable than another complementary combination of the two memory states. The reliability may be due to a magnitude of separation of at least one sensing voltage from a threshold voltage distribution of either the first memory state or the second memory state being greater than a separation of the at least one sensing voltage from a threshold voltage distribution of the other memory state.

For example, as shown in FIG. 2A, sensing voltage 210-1 is selectably positioned marginal to threshold voltage distributions 208-1 and 209-1, corresponding to memory states 202-1 and 205-1 having a data value of 0, and sensing voltage 211-1 is selectably positioned marginal to threshold voltage distributions 208-2 and 209-2, corresponding to memory states 202-2 and 205-2 having a data value of 1. A determination that the one combination of sensed memory states is more readably reliable may be based on the greater magnitude of the separation, thereby having a corresponding greater shift to reach the sensing voltage being less probable than a shift resulting from a lesser separation in the other combination of sensed memory states. Accordingly, as shown in FIG. 2A, sensing voltage 210-1 is used for the reference memory cell 201-1 and is at a greater separation from threshold voltage distribution 208-2 in memory state 202-2, having a data value of 1, than the separation of sensing voltage 210-1 is from threshold voltage distribution 208-1 in memory state 202-1, having a data value of 0. In addition, sensing voltage 211-1 is used for the intended memory cell 204-1 and is at a greater separation from threshold voltage distribution 209-1 in memory state 205-1, having a data value of 0, than the separation of sensing voltage 211-1 is from threshold voltage distribution 209-2 in memory state 205-2, having a data value of 1.

Hence, with the sensing voltages 210-1 and 211-1 positioned as such relative to the potential threshold voltage distributions in the reference memory cell 201-1 and the intended memory cell 204-1, the greater separations and corresponding greater shift in at least a portion of the threshold voltage distributions to reach the respective sensing voltages may result in (e.g., cause) sensing of memory state 202-2, having a data value of 1, for the reference memory cell 201-1 and sensing of memory state 205-1, having a data value of 0, for the intended memory cell 204-1 being readably reliable. As used herein, being readably reliable is intended to mean the sensed memory states being more reliable than, for example as shown in FIG. 2A, sensing of memory state 202-1, having a data value of 0, using sensing voltage 210-1 for the reference memory cell 201-1 and sensing of memory state 205-2, having a data value of 1, using sensing voltage 211-1 for the intended memory cell 204-1.

As used herein, the lesser reliability is intended to mean that the other combination of the two memory states is less readably reliable due to a first magnitude of separation of a first sensing voltage from a first distribution of the first memory state and a second magnitude of separation of a second sensing voltage from a second distribution of the second memory state being less than separations of sensing voltages from the respective distributions of the first and second memory states in the more readably reliable one combination. For example, as shown in FIG. 2A, the lesser reliability of the data value of 0 for the reference memory cell 201-1 and the data value of 1 for the intended memory cell 204-1 may result from (e.g., be caused by) the lesser separations and corresponding lesser shift in at least a portion of the threshold voltage distributions to reach the respective sensing voltages.

The present disclosure describes determining which of two memory cells (e.g., memory cells 201-1 or 204-1) has switched their memory state due to a shift in at least a portion of a threshold voltage distribution (e.g., a shift in magnitude of voltage stored by at least some of the memory cells in the distribution) relative to a magnitude of a sensing voltage (e.g., sensing voltages 210-1 and 211-1) in the sense window 212-1. As shown in FIG. 2A, a magnitude of a first sensing voltage (e.g., 210-1) may be selectably closer to a first threshold voltage distribution (e.g., 208-1) than to a second threshold voltage distribution (e.g., 208-2) in the sense window 212-1. The switch in the memory state may, for example, be due to a shift in a second threshold voltage distribution (e.g., 208-2) relative to a magnitude of the second sensing voltage (e.g., 211-1) in the sense window 212-1 rather than to the magnitude of the first sensing voltage (e.g., 210-1) because of the lesser separation from the second sensing voltage (e.g., 211-1) relative to the first sensing voltage (e.g., 210-1). Because there is a low probability of two paired memory cells switching memory states due to a shift at the same point in time, determining which of the two memory cells has switched their memory state at that point in time may enable prompt correction of the switched memory state back to the complementary memory state (e.g., before the other memory cell potentially switches memory states) to improve reliability and/or accuracy of stored data.

Various factors may contribute to a switch of a memory state due to a shift in at least a portion of a threshold voltage distribution. For example, the shift may be contributed to by at least one of: a widening of the first threshold voltage distribution (e.g., 208-1, 209-1) for a first subset of memory cells to at least overlap the first sensing voltage (e.g., 210-1); a widening of the second threshold voltage distribution (e.g., 208-2, 209-2) for a second subset of memory cells to at least overlap the second sensing voltage (e.g., 211-1); a drift of the first threshold voltage distribution for the first subset of memory cells to a first larger median magnitude of the polarity to at least overlap the first sensing voltage; a drift of the second threshold voltage distribution for the second subset of memory cells to a second larger median magnitude of the polarity to at least overlap the second sensing voltage; a first disturbance of the memory states of the first subset of memory cells by performance of read or write operations on at least some of the memory cells in the first subset such that the first threshold voltage distribution at least overlaps the first sensing voltage; and/or a second disturbance of the memory states of the second subset of memory cells by performance of read or write operations on at least some of the memory cells in the second subset such that the second threshold voltage distribution at least overlaps the second sensing voltage; among other possible contributors to shifting a threshold voltage distribution.

There is a low probability that the same factor would affect the reliability of the two memory states for the two memory cells at the same time, which contributes to the low probability of two paired memory cells switching memory states at the same point in time. For example, a drift of the first threshold voltage distribution 208-1 to a first larger median magnitude may result in at least one memory cell overlapping the closer first sensing voltage 210-1 because the drift would be toward the closer first sensing voltage 210-1. In contrast, a drift of the second threshold voltage distribution 209-2 to a second larger median magnitude would not result in any memory cells overlapping the closer second sensing voltage 211-1 because the drift would be away from the closer second sensing voltage 211-1.

The example described in connection with FIG. 2A may, in a number of embodiments, be associated with a truth table 213-1. The truth table 213-1 may be configured to enable comparison of a sensed memory state of a first memory cell (e.g., reference memory cell 201-1) to a sensed memory state of a second memory cell (e.g., intended memory cell 204-1), determination of a switch in the memory state due to the shift by determination that the sensed memory states match (e.g., both memory states being 0 or both memory states being 1), and determination of which of the two memory cells has switched from one memory state to another memory state. Switching from one memory state to another memory state is intended to mean that the two memory cells originally stored complementary memory states (e.g., a data value of 0 in one memory cell and a data value of 1 in the other memory cell) and one of the memory cells switched (changed) its memory state such that the memory states of the two memory cells then match. Responsive to the determination of which of the two memory cells has switched from the one memory state to the other memory state using the truth table 213-1, the circuitry is configured to reprogram the memory cell that has switched back to its complementary memory state to enable determination, as intended, of the one data value from the memory states of the two memory cells (e.g., validating the memory state of the intended memory cell 204-1).

The determination of which of the two memory cells has switched from one memory state to another memory state is based at least in part on one combination of the two memory states that is complementary being more readably reliable than another complementary combination of the two memory states. As indicated herein, the memory state 202-2, having a data value of 1, for the reference memory cell 201-1 and the memory state 205-1, having a data value of 0, for the intended memory cell 204-1 is more readably reliable. The reliability is due to a magnitude of separation of sensing voltage 210-1 from the threshold voltage distribution 208-2 of memory state 202-2 being greater than a separation of sensing voltage 210-1 from the threshold voltage distribution 208-1 of memory state 202-1. The reliability is further due to a magnitude of separation of sensing voltage 211-1 from the threshold voltage distribution 209-1 of memory state 205-1 being greater than a separation of sensing voltage 211-1 from the threshold voltage distribution 209-2 of memory state 205-2.

The determination of which of the two memory cells has switched is further based at least in part on the circuitry being configured to use the truth table 213-1, responsive to the determination that the two memory states match, to use the more readably reliable one combination of the two memory states for a first memory cell and a second memory cell of the two memory cells as a stable combination based on being less probable to switch. As described herein, the combination of memory state 202-2, having a data value of 1, for the first memory cell (1st MC) 201-1 and memory state 205-1, having a data value of 0, for the second memory cell (2nd MC) 204-1 is the more readably reliable combination (e.g., based on being stable and less probable to switch), as shown in row 215 in the truth table 213-1. As a RESULT of the two data values being complementary, data value 0 of the second memory cell 204-1 is validated based on a determination that no SWITCH has occurred in either memory cell, as indicated in the truth table 213-1 by N/A.

The combination of memory state 202-1, having a data value of 0, for the first memory cell 201-1 and memory state 205-2, having a data value of 1, for the second memory cell 204-1 is the less readably reliable combination (e.g., based on being more probable to switch), as shown in row 214 in the truth table 213-1. As a RESULT of the two data values being complementary, data value 1 of the second memory cell 204-1 is validated based on a determination that no SWITCH has occurred in either memory cell, as indicated in the truth table 213-1 by N/A.

The truth table 213-1 may indicate the less readably reliable complementary other combination of the two memory states for the first memory cell and the second memory cell shown in row 214 as the combination that has switched based on being more probable to switch. The truth table 213-1 may be further used to compare the matched memory states sensed from the first memory cell and the second memory cell to the less readably reliable complementary other combination of the two memory states for the first and second memory cells shown in row 214.

The truth table 213-1 may be used to enable determination that a first memory cell has switched from one memory state to another memory state based on the matched memory state sensed from the first memory cell differing from a memory state for the first memory cell in the complementary other combination. For example, as shown in FIG. 2A, the less reliable combination shown in row 214 is compared to sensed matching data values of 0 and 0 in row 216 for the first memory cell 201-1 and the second memory cell 204-1. Because the data value is 0 for the first memory cell 201-1 in the combination shown in row 214 and the sensed data value in row 216 for the second memory cell is also 0, it can be determined that the first memory cell did not switch to another memory state. However, because the data value is 1 for the second memory cell 204-1 in the combination shown in row 214 and the sensed data value in row 216 for the second memory cell differs from 1, by being 0, it can be determined 218 that the second memory cell did switch to another memory state, as indicated in the SWITCH column for row 216 of truth table 213-1.

In addition, the truth table 213-1 may be used to enable determination that a second memory cell has switched from one memory state to another memory state based on the matched memory state sensed from the second memory cell differing from the memory state for the second memory cell in the complementary other combination. For example, as shown in FIG. 2A, the less reliable combination shown in row 214 is compared to sensed matching data values of 1 and 1 in row 217 for the first memory cell 201-1 and the second memory cell 204-1. Because the data value is 1 for the second memory cell 201-1 in the combination shown in row 214 and the sensed data value in row 217 for the second memory cell is also 1, it can be determined that the second memory cell did not switch to another memory state. However, because the data value is 0 for the second memory cell 204-1 in the combination shown in row 214 and the sensed data value in row 217 for the first memory cell differs from 0, by being 1, it can be determined 219 that the first memory cell did switch to another memory state, as indicated in the SWITCH column for row 217 of truth table 213-1.

Hence, the truth table 213-1 may be used to enable determining which of the two memory cells has switched their memory state due to a shift in its threshold voltage distribution relative to a magnitude of a corresponding sensing voltage. The determination may be based on comparing an inverse of a pair of memory states determined to be reliable (e.g., the memory states shown in row 214 of truth table 213-1 being the inverse of the reliable memory states shown in row 215) for the first and second memory cells to the sensed memory states of the first and second memory cells. The determination may be further based on determining which of the two memory cells has switched their memory state based on which memory cell has a sensed memory state that differs from the inverse of the pair of memory states for the first and second memory cells.

Moreover, the truth table 213-1 may be used to enable, responsive to determination of which of the two memory cells has switched their memory state, reprogramming the memory cell that has switched its memory state back to its complementary memory state. For example, as shown in FIG. 2A, the determination 218 that the data value of 1 for the second memory cell shown in row 214 has switched to a data value of 0 for the second memory cell shown in row 216 enables reprogramming of the second memory cell back to its original memory state of 1. In addition, the determination 219 that the data value of 0 for the first memory cell shown in row 214 has switched to a data value of 1 for the first memory cell shown in row 217 enables reprogramming of the first memory cell back to its original memory state of 0. Reprogramming the switched memory state of either the first memory cell or the second memory cell back to their original complementary memory states may enable determining the one data value as intended from the complementary memory states of the two memory cells, as indicated in the RESULT column of truth table 213-1.

Accordingly, FIG. 2A illustrates programming two memory cells in a negative polarity for a negative read using one of a pair of complementary memory states for the first memory cell and another of the pair for the second memory cell. A first memory cell 201-1 may store a reference memory state and a second memory cell 204-1 may store an intended memory state to be compared to the reference memory state of the first memory cell. Determining a difference between the first memory state and the second memory state may be based on a difference in a magnitude of an absolute value of a voltage stored by each of the two memory cells. A memory cell that has a voltage value in a threshold voltage distribution 208-1, 209-1 with a lesser magnitude is in the first memory state 202-1, 205-1 and a memory cell that has a voltage value in a threshold voltage distribution 208-2, 209-2 with a greater magnitude is in the second memory state 202-2, 205-2. The first sensing voltage 210-1 may be selectably positioned in the sense window 212-1 at a greater magnitude than, and marginal to, the threshold voltage distribution 208-1, 209-1 with the lesser magnitude and the second sensing voltage 211-1 in the sense window 212-1 may be selectably positioned at a lesser magnitude than, and marginal to, the threshold voltage distribution 208-2, 209-2 with the greater magnitude.

The first sensing voltage 210-1 may be used to determine whether the first memory cell 201-1 is in the first memory state 202-1 or in the second memory state 202-2 and the second sensing voltage 211-1 may be used to determine whether the second memory cell 204-1 is in the first memory state 205-1 or in the second memory state 205-2. The first memory cell storing the reference memory state as the second memory state at the greater magnitude and the second memory cell storing the intended memory state as the first memory state at the lesser magnitude is readably reliable, as shown in row 215 of truth table 213-1. The greater reliability is based on the threshold voltage distribution 208-2 for the first memory cell 201-1 with the greater magnitude in the second memory state being more separated from the first sensing voltage 210-1 than the threshold voltage distribution 208-1 with the lesser magnitude in the first memory state and the threshold voltage distribution 209-1 for the second memory cell 204-1 with the lesser magnitude in the first memory state being more separated from the second sensing voltage 211-1 than the threshold voltage distribution 209-2 with the greater magnitude in the second memory state.

Based on the greater reliability of the combination shown in row 215, a determination may be made that the inverse of the pair of readably reliable complementary memory states, in which the first memory cell stores the reference memory state as the first memory state at the lesser magnitude and the second memory cell stores the intended memory state as the second memory state at the greater magnitude, as shown in row 214 of truth table 213-1, is less readably reliable by being more probable to have a memory cell switch memory states due to a shift in a threshold voltage distribution to at least partially overlap the marginal first sensing voltage and/or the marginal second sensing voltage. The less readably reliable first memory state of the first memory cell and second memory state of the second memory cell shown in row 214 may be compared to a sensed memory state of the first memory cell that stores the reference memory state and a sensed memory state of the second memory cell that stores the intended memory state.

The comparison may result in determining that the second memory cell stores the reference memory state, having a data value of 0, and is the second memory cell that has switched from one memory state to another memory state based on a difference between the less readably reliable first memory state of the second memory cell, having a data value of 1, and the sensed memory state of the second memory cell. Alternatively, the comparison may result in determining that the first memory cell that stores the intended memory state, having a data value of 1, is the first memory cell that has switched from one memory state to another memory state based on a difference between the less readably reliable second memory state of the first memory cell, having a data value of 0, and the sensed memory state of the first memory cell.

Figure 2B:
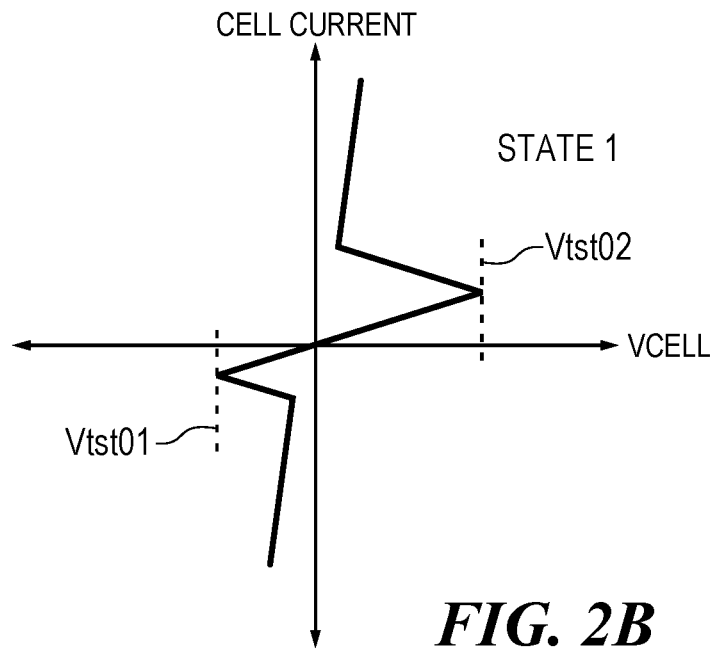
FIG. 2B is an example of a current-versus-voltage curve corresponding to a memory state of the threshold voltage distributions shown in FIG. 2A, in accordance with an embodiment of the present disclosure.
Figure 2C:
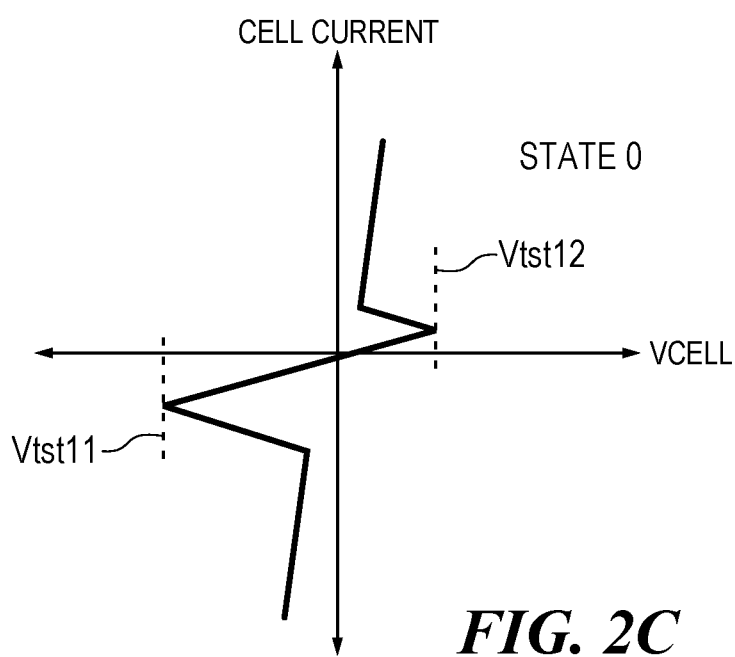
FIG. 2C is an example of a current-versus-voltage curve corresponding to another memory state of the threshold voltage distributions shown in FIG. 2A, in accordance with an embodiment of the present disclosure.

FIGS. 2B and 2C are examples of current-versus-voltage curves corresponding to the memory states of the threshold voltage distributions shown in FIGS. 2A and 2D-2G, in accordance with an embodiment of the present disclosure. In this example, the curves in FIGS. 2B and 2C correspond to memory cells in which memory state 1 is designated as the higher threshold voltage state in a particular polarity (positive polarity direction in this example), and in which memory state 0 is designated as the higher threshold voltage state in the opposite polarity (negative polarity direction in this example). In various embodiments, the memory state designation can be interchanged such that memory state 0 could correspond to the higher threshold voltage state in the positive polarity direction with memory state 1 corresponding to the higher threshold voltage state in the negative direction. The examples of current-versus-voltage curves corresponding to the memory states described in connection with FIGS. 2B and 2C are also applicable to embodiments in which both of a pair of memory cells are in the same polarity (e.g., both in a negative polarity 206 or both in a positive polarity 207), as illustrated and described in connection with FIGS. 2A and 2D-2G.

FIGS. 2B and 2C illustrate memory cell snapback as described herein. VCELL can represent an applied voltage across the memory cell. For example, VCELL can be a voltage applied to a top electrode corresponding to the memory cell minus a voltage applied to a bottom electrode corresponding to the memory cell (e.g., via a respective word line and bit line). As shown in FIG. 2B, responsive to an applied positive polarity voltage (VCELL), a memory cell programmed to memory state 1 (e.g., in a threshold voltage distribution) is in a non-conductive state until VCELL reaches voltage Vtst02, at which point the memory cell transitions to a conductive (e.g., lower resistance) state. This transition can be referred to as a snapback event, which occurs when the voltage applied across the memory cell (in a particular polarity) exceeds the memory cell's threshold voltage. Accordingly, voltage Vtst02 can be referred to as a snapback voltage. In FIG. 2B, voltage Vtst01 corresponds to a snapback voltage for a memory cell programmed to memory state 1 (e.g., in another threshold voltage distribution). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to memory state 0 (e.g., in a threshold voltage distribution) is in a non-conductive state until VCELL reaches voltage Vtst11, at which point the memory cell snaps back to a conductive (e.g., lower resistance) state. In FIG. 2C, voltage Vtst12 corresponds to the snapback voltage for a memory cell programmed to memory state 0 (e.g., in another threshold voltage distribution). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching memory states. For instance, if a VCELL exceeding Vtst02 is applied to a memory cell in memory state 1, the resulting snapback event may reduce the threshold voltage of the memory cell to a level below a respective sensing voltage, as described herein, which would result in the memory cell being sensed (read) as memory state 0 rather than memory state 1. As such, in a number of embodiments, a snapback event can switch a memory cell to the opposite state (e.g., from memory state 1 to memory state 0 and vice versa), as described in connection with FIGS. 2A and 2D-2G.

Figure 2D:
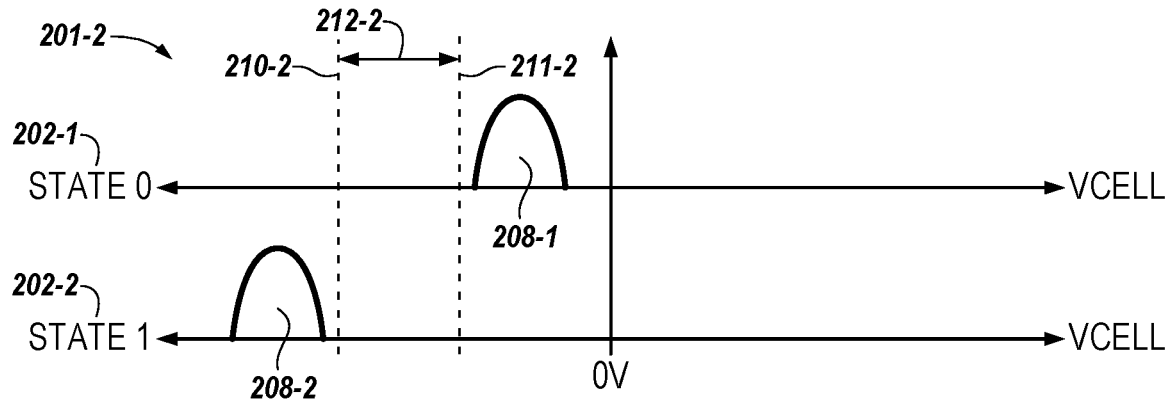
FIG. 2D is another example of sensing threshold voltage distributions associated with memory states of memory cells for two memory cells being sensed to determine one data value, in accordance with another embodiment of the present disclosure.
Figure 2D:
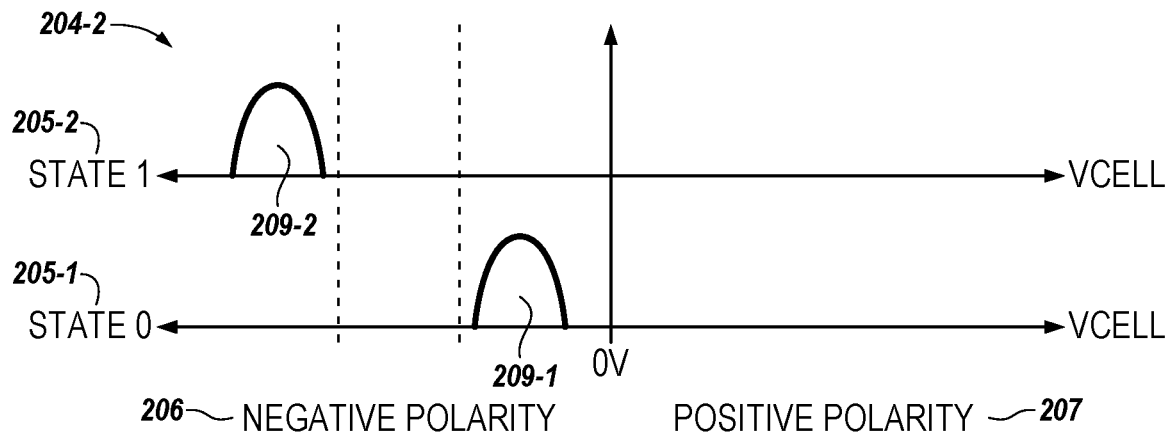

FIG. 2D illustrates another example of sensing threshold voltage distributions associated with memory states of memory cells for two memory cells being sensed to determine one data value, in accordance with another embodiment of the present disclosure. To reduce duplication of description, details of the memory states, the threshold voltage distributions, and the truth table described in connection with FIG. 2A are, where appropriate, to be considered as incorporated into the description of FIGS. 2D-2G.

FIG. 2D illustrates an alternative embodiment consistent with FIG. 2A, except that positioning of the sensing voltages 210-2 and 211-2 for the sense window 212-2 in FIG. 2D has been changed (e.g., reversed) relative to FIG. 2A. Accordingly, FIG. 2D also illustrates programming the two memory cells 201-2 and 204-2 in a negative polarity 206 for a negative read using one of a pair of complementary memory states for the first memory cell and another of the pair for the second memory cell. The first memory cell 201-2 may store a reference memory state and the second memory cell 204-2 may store an intended memory state to be compared to the reference memory state of the first memory cell.

In contrast to FIG. 2A, FIG. 2D illustrates using the first sensing voltage 211-2 to determine whether the second memory cell 204-2 is in the first memory state 205-1 or in the second memory state 205-2 and using the second sensing voltage 210-2 to determine whether the first memory cell 201-2 is in the first memory state 202-1 or in the second memory state 202-2. A determination may be made that the first memory cell 201-2 storing the reference memory state as the first memory state 202-1 at the lesser magnitude and the second memory cell 204-2 storing the intended memory state as the second memory state 205-2 at the greater magnitude is readably reliable. The determination of reliability may be based on the threshold voltage distribution 208-1 with the lesser magnitude in the first memory state 202-1 for the reference memory cell 201-2 being more separated from the second sensing voltage 210-2 than the threshold voltage distribution 208-2 with the greater magnitude in the second memory state 202-2 and the threshold voltage distribution 209-2 with the greater magnitude in the second memory state 205-2 for the intended memory cell 204-2 being more separated from the first sensing voltage 211-2 than the threshold voltage distribution 209-1 with the lesser magnitude in the first memory state 205-1.

The determination may be based on comparing an inverse of a pair of memory states determined to be reliable (e.g., the memory states shown in row 215 of truth table 213-2 being the inverse of the reliable memory states shown in row 214) for the first and second memory cells to the sensed memory states of the first and second memory cells. The determination may be further based on determining which of the two memory cells has switched their memory state based on which memory cell has a sensed memory state that differs from the inverse of the pair of memory states for the first and second memory cells. The determination may be based on the inverse of the pair of readably reliable complementary memory states, in which the first memory cell 201-2 stores the reference memory state as the second memory state 208-2 at the greater magnitude and the second memory cell 204-2 stores the intended memory state as the first memory state 209-1 at the lesser magnitude, being less readably reliable by being more probable to have a memory cell switch memory states due to a shift in a threshold voltage distribution to at least partially overlap the marginal first sensing voltage 211-2 and/or the marginal second sensing voltage 210-2.

The example described in connection with FIG. 2D may, in a number of embodiments, be associated with truth table 213-2. The truth table 213-2 may be used to enable comparison of the less readably reliable second memory state 202-2 of the first memory cell 201-2 and first memory state 202-2 of the second memory cell 204-2 to a sensed memory state of the first memory cell that stores the reference memory state and a sensed memory state of the second memory cell that stores the intended memory state.

The comparison may result in determining 219, as shown in row 216 of truth table 213-2, that the first memory cell (1st MC) 201-2 that stores the reference memory state is the memory cell that has switched from one memory state to another memory state based on a difference between the less readably reliable first memory state of the first memory cell (e.g., data value 1) and the sensed memory state of the first memory cell (e.g., data value 0). Alternatively, the comparison may result in determining 218, as shown in row 217 of truth table 213-2, that the second memory cell (2nd MC) 204-2 that stores the intended memory state is the memory cell that has switched from one memory state to another memory state based on a difference between the less readably reliable first memory state of the first memory cell (e.g., data value 0) and the sensed memory state of the second memory cell (e.g., data value 1).

Moreover, the truth table 213-2 may be used to enable, responsive to determination of which of the two memory cells has switched their memory state, reprogramming the memory cell that has switched its memory state back to its complementary memory state. For example, as shown in FIG. 2D, the determination 218 that the data value of 0 for the second memory cell shown in row 215 has switched to a data value of 1 for the second memory cell shown in row 217 enables reprogramming of the second memory cell back to its original memory state of 0. In addition, the determination 219 that the data value of 1 for the first memory cell shown in row 215 has switched to a data value of 0 for the first memory cell shown in row 216 enables reprogramming of the first memory cell back to its original memory state of 1. Reprogramming the switched memory state of either the first memory cell or the second memory cell back to their original complementary memory states may enable determining the one data value as intended from the complementary memory states of the two memory cells, as indicated in the RESULT column of truth table 213-2.

Figure 2E:
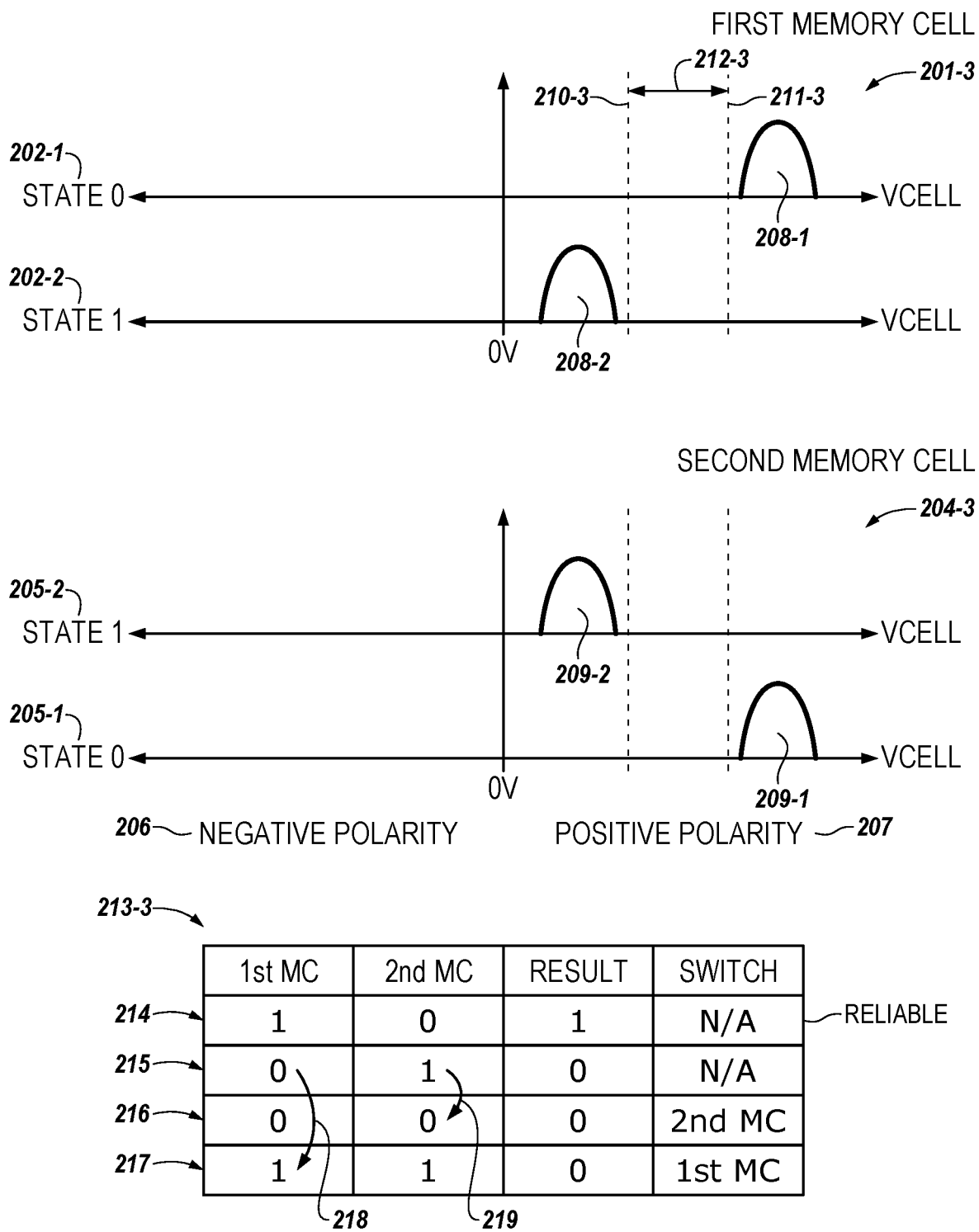
FIG. 2E is an another such example, in accordance with another embodiment of the present disclosure.

FIG. 2E illustrates another example of sensing threshold voltage distributions associated with memory states of memory cells for two memory cells being sensed to determine one data value, in accordance with another embodiment of the present disclosure. FIG. 2E illustrates an alternative embodiment consistent with FIG. 2A, except that positioning (e.g., polarity) of the sensing voltages 210-3 and 211-3 for the sense window 212-3 in FIG. 2E has been changed relative to FIG. 2A. FIG. 2E also differs from FIGS. 2A and 2D in that FIG. 2E illustrates programming the two memory cells 201-3, 204-3 in a positive polarity 207 for a positive read using one of a pair of complementary memory states for the first memory cell and another of the pair for the second memory cell. Also differing from FIGS. 2A and 2D is that in FIG. 2E the first memory cell 201-3 may store an intended memory state and the second memory cell 204-3 may store a reference memory state to be compared to the intended memory state of the first memory cell rather than vice versa.

A difference between a first memory state 202-1, 205-1 and a second memory state 202-2, 205-2 may be determined based on a difference in a magnitude of an absolute value of a voltage stored by each of the two memory cells. Accordingly, a memory cell that has a voltage value in a threshold voltage distribution 208-1, 209-1 with a greater magnitude is in the first memory state, having a data value of 0, and a memory cell that has a voltage value in a threshold voltage distribution 208-2, 209-2 with a lesser magnitude is in the second memory state, having a data value of 1. A first sensing voltage 210-3 may be selectably positioned in a sense window 212-3 at a greater magnitude than, and marginal to, the threshold voltage distribution 208-2, 209-2 with the lesser magnitude. A second sensing voltage 211-3 may be selectably positioned in the sense window 212-3 at a lesser magnitude than, and marginal to, the threshold voltage distribution 208-1, 209-1 with the greater magnitude.

FIG. 2E illustrates using the first sensing voltage 210-3 to determine whether the second memory cell 204-3 that stores the reference memory state is in the first memory state 205-1 or in the second memory state 205-2 and using the second sensing voltage 211-3 to determine whether the first memory cell 201-3 that stores the intended memory state is in the first memory state 202-1 or in the second memory state 202-2. A determination may be made that the first memory cell 201-3 storing the intended memory state as the second memory state 202-2 at the lesser magnitude, having a data value of 1, and the second memory cell 204-3 storing the reference memory state as the first memory state 205-1 at the greater magnitude, having a data value of 0, is readably reliable.

The determination of reliability may be based on the threshold voltage distribution 209-1 with the greater magnitude in the first memory state 205-1 for the reference memory cell 204-3 being more separated from the first sensing voltage 210-3 than the threshold voltage distribution 209-2 with the lesser magnitude in the second memory state 205-2 and the threshold voltage distribution 208-2 with the lesser magnitude in the second memory state 202-2 for the intended memory cell 201-3 being more separated from the second sensing voltage 211-3 than the threshold voltage distribution 208-1 with the greater magnitude in the first memory state 202-1.

The determination may be based on comparing an inverse of a pair of memory states determined to be reliable (e.g., the memory states shown in row 215 of truth table 213-3 being the inverse of the reliable memory states shown in row 214) for the first and second memory cells to the sensed memory states of the first and second memory cells. The determination may be further based on determining which of the two memory cells has switched their memory state based on which memory cell has a sensed memory state that differs from the inverse of the pair of memory states for the first and second memory cells. The determination may be based on the inverse of the pair of readably reliable complementary memory states, in which the first memory cell 201-3 stores the intended memory state as the first memory state 202-1 at the greater magnitude and the second memory cell 204-3 stores the reference memory state as the second memory state 205-2 at the lesser magnitude, being less readably reliable by being more probable to have a memory cell switch memory states due to a shift in a threshold voltage distribution to at least partially overlap the marginal first sensing voltage 210-3 and/or the marginal second sensing voltage 211-3.

The example described in connection with FIG. 2E may, in a number of embodiments, be associated with truth table 213-3. The truth table 213-3 may be used to enable comparison of the less readably reliable first memory state 202-1 of the first memory cell 201-3 and second memory state 205-2 of the second memory cell 204-3 to a sensed memory state of the first memory cell that stores the intended memory state and a sensed memory state of the second memory cell that stores the reference memory state.

The comparison may result in determining 219, as shown in row 216 of truth table 213-3, that the second memory cell (2nd MC) 204-3 that stores the reference memory state is the memory cell that has switched from one memory state to another memory state based on a difference between the less readably reliable second memory state of the second memory cell (e.g., data value 1) and the sensed memory state of the second memory cell (e.g., data value 0). Alternatively, the comparison may result in determining 218, as shown in row 217 of truth table 213-3, that the first memory cell (1st MC) 201-3 that stores the intended memory state is the memory cell that has switched from one memory state to another memory state based on a difference between the less readably reliable first memory state of the first memory cell (e.g., data value 0) and the sensed memory state of the first memory cell (e.g., data value 1).

Moreover, the truth table 213-3 may be used to enable, responsive to determination of which of the two memory cells has switched their memory state, reprogramming the memory cell that has switched its memory state back to its complementary memory state. For example, as shown in FIG. 2E, the determination 218 that the data value of 0 for the first memory cell shown in row 215 has switched to a data value of 1 for the first memory cell shown in row 217 enables reprogramming of the first memory cell back to its original memory state of 0. In addition, the determination 219 that the data value of 1 for the second memory cell shown in row 215 has switched to a data value of 0 for the second memory cell shown in row 216 enables reprogramming of the second memory cell back to its original memory state of 1. Reprogramming the switched memory state of either the second memory cell or the first memory cell back to their original complementary memory states may enable determining the one data value as intended from the complementary memory states of the two memory cells, as indicated in the RESULT column of truth table 213-3.

Figure 2F:
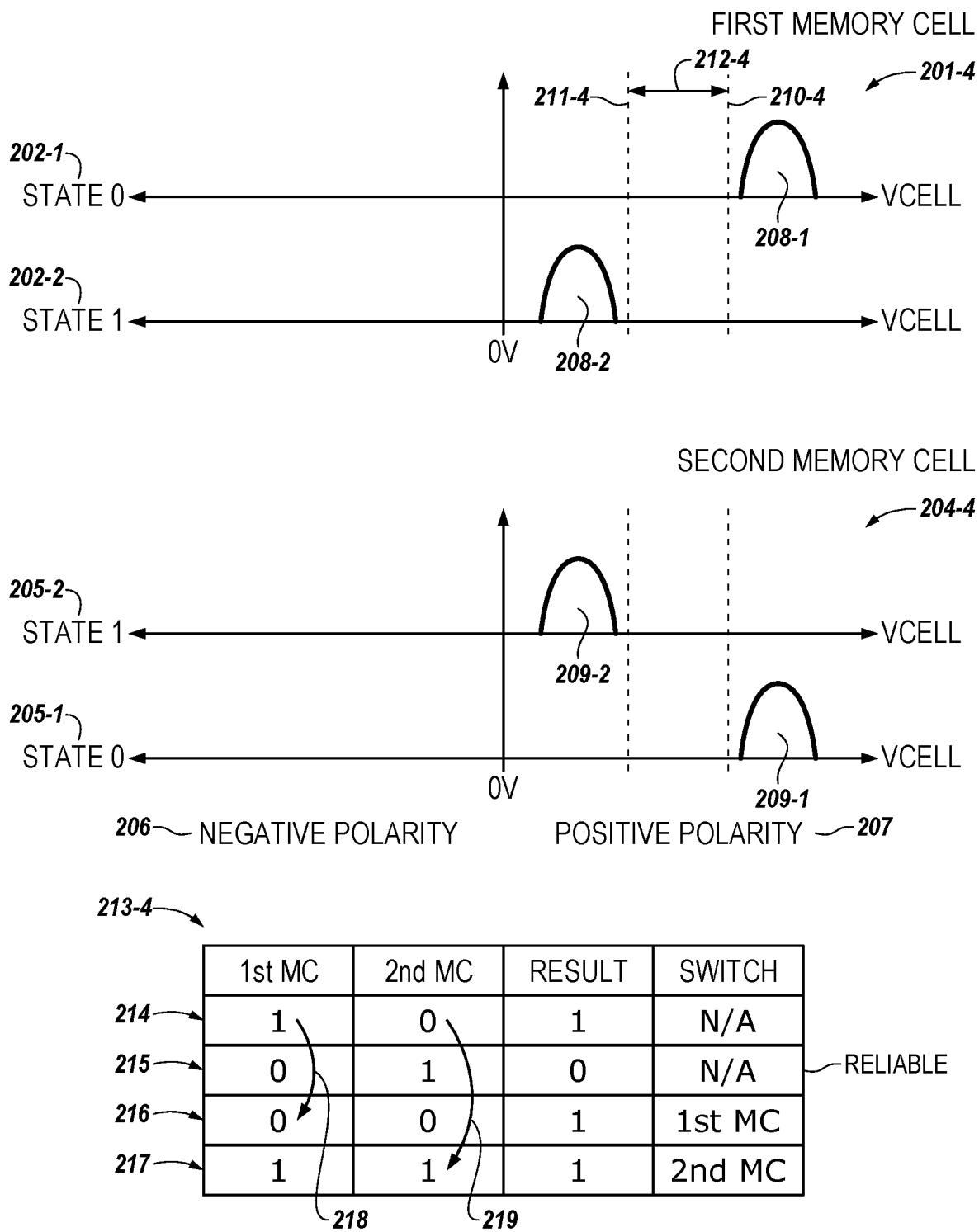
FIG. 2F is an another such example, in accordance with another embodiment of the present disclosure.

FIG. 2F illustrates another example of sensing threshold voltage distributions associated with memory states of memory cells for two memory cells being sensed to determine one data value, in accordance with another embodiment of the present disclosure. FIG. 2F illustrates an alternative embodiment consistent with FIG. 2E, except that positioning of the sensing voltages 210-4 and 211-4 for the sense window 212-4 in FIG. 2F has been changed (e.g., reversed) relative to FIG. 2E. Accordingly, FIG. 2F also illustrates programming the two memory cells 201-4 and 204-4 in a positive polarity 207 for a positive read using one of a pair of complementary memory states for the first memory cell and another of the pair for the second memory cell. The first memory cell 201-4 may store an intended memory state and the second memory cell 204-4 may store a reference memory state to be compared to the intended memory state of the first memory cell.

A difference between a first memory state 202-1, 205-1 and a second memory state 202-2, 205-2 may be determined based on a difference in a magnitude of an absolute value of a voltage stored by each of the two memory cells. Accordingly, a memory cell that has a voltage value in a threshold voltage distribution 208-1, 209-1 with a greater magnitude is in the first memory state, having a data value of 0, and a memory cell that has a voltage value in a threshold voltage distribution 208-2, 209-2 with a lesser magnitude is in the second memory state, having a data value of 1. A first sensing voltage 210-4 may be selectably positioned in a sense window 212-4 at a lesser magnitude than, and marginal to, the threshold voltage distribution 208-1, 209-1 with the greater magnitude. A second sensing voltage 211-4 may be selectably positioned in the sense window 212-4 at a greater magnitude than, and marginal to, the threshold voltage distribution 208-2, 209-2 with the lesser magnitude.

FIG. 2F illustrates using the first sensing voltage 210-4 to determine whether the second memory cell 204-4 is in the first memory state 205-1 or in the second memory state 205-2 and using the second sensing voltage 211-4 to determine whether the first memory cell 201-4 is in the first memory state 202-1 or in the second memory state 202-2. A determination may be made that the first memory cell 201-4 storing the intended memory state as the first memory state 202-1 at the greater magnitude, having a data value of 0, and the second memory cell 204-4 storing the reference memory state as the second memory state 205-2 at the lesser magnitude, having a data value of 1, is readably reliable.

The determination of reliability may be based on the threshold voltage distribution 209-2 with the lesser magnitude in the second memory state 205-2 for the reference memory cell 204-2 being more separated from the first sensing voltage 210-4 than the threshold voltage distribution 209-1 with the greater magnitude in the first memory state 205-1 and the threshold voltage distribution 208-1 with the greater magnitude in the first memory state 202-1 for the intended memory cell 201-4 being more separated from the second sensing voltage 211-4 than the threshold voltage distribution 208-2 with the lesser magnitude in the second memory state 202-2.

The determination may be based on comparing an inverse of a pair of memory states determined to be reliable (e.g., the memory states shown in row 214 of truth table 213-4 being the inverse of the reliable memory states shown in row 215) for the first and second memory cells to the sensed memory states of the first and second memory cells. The determination may be further based on determining which of the two memory cells has switched their memory state based on which memory cell has a sensed memory state that differs from the inverse of the pair of memory states for the first and second memory cells. The determination may be based on the inverse of the pair of readably reliable complementary memory states, in which the first memory cell 201-4 stores the intended memory state as the second memory state 202-2 at the lesser magnitude and the second memory cell 204-4 stores the reference memory state as the first memory state 205-1 at the greater magnitude, being less readably reliable by being more probable to have a memory cell switch memory states due to a shift in a threshold voltage distribution to at least partially overlap the marginal first sensing voltage 210-4 and/or the marginal second sensing voltage 211-4.

The example described in connection with FIG. 2F may, in a number of embodiments, be associated with truth table 213-4. The truth table 213-4 may be used to enable comparison of the less readably reliable second memory state 202-2 of the first memory cell 201-4 and first memory state 205-1 of the second memory cell 204-4 to a sensed memory state of the first memory cell that stores the intended memory state and a sensed memory state of the second memory cell that stores the reference memory state.

The comparison may result in determining 219, as shown in row 217 of truth table 213-4, that the second memory cell (2nd MC) 204-4 that stores the reference memory state is the memory cell that has switched from one memory state to another memory state based on a difference between the less readably reliable first memory state of the second memory cell (e.g., data value 0) and the sensed memory state of the second memory cell (e.g., data value 1). Alternatively, the comparison may result in determining 218, as shown in row 216 of truth table 213-4, that the first memory cell (1st MC) 201-4 that stores the intended memory state is the memory cell that has switched from one memory state to another memory state based on a difference between the less readably reliable first memory state of the first memory cell (e.g., data value 1) and the sensed memory state of the first memory cell (e.g., data value 0).

Moreover, the truth table 213-4 may be used to enable, responsive to determination of which of the two memory cells has switched their memory state, reprogramming the memory cell that has switched its memory state back to its complementary memory state. For example, as shown in FIG. 2F, the determination 218 that the data value of 1 for the first memory cell shown in row 214 has switched to a data value of 0 for the first memory cell shown in row 216 enables reprogramming of the first memory cell back to its original memory state of 1. In addition, the determination 219 that the data value of 0 for the second memory cell shown in row 214 has switched to a data value of 1 for the second memory cell shown in row 217 enables reprogramming of the second memory cell back to its original memory state of 0. Reprogramming the switched memory state of either the second memory cell or the first memory cell back to their original complementary memory states may enable determining the one data value as intended from the complementary memory states of the two memory cells, as indicated in the RESULT column of truth table 213-4.

Figure 2G:
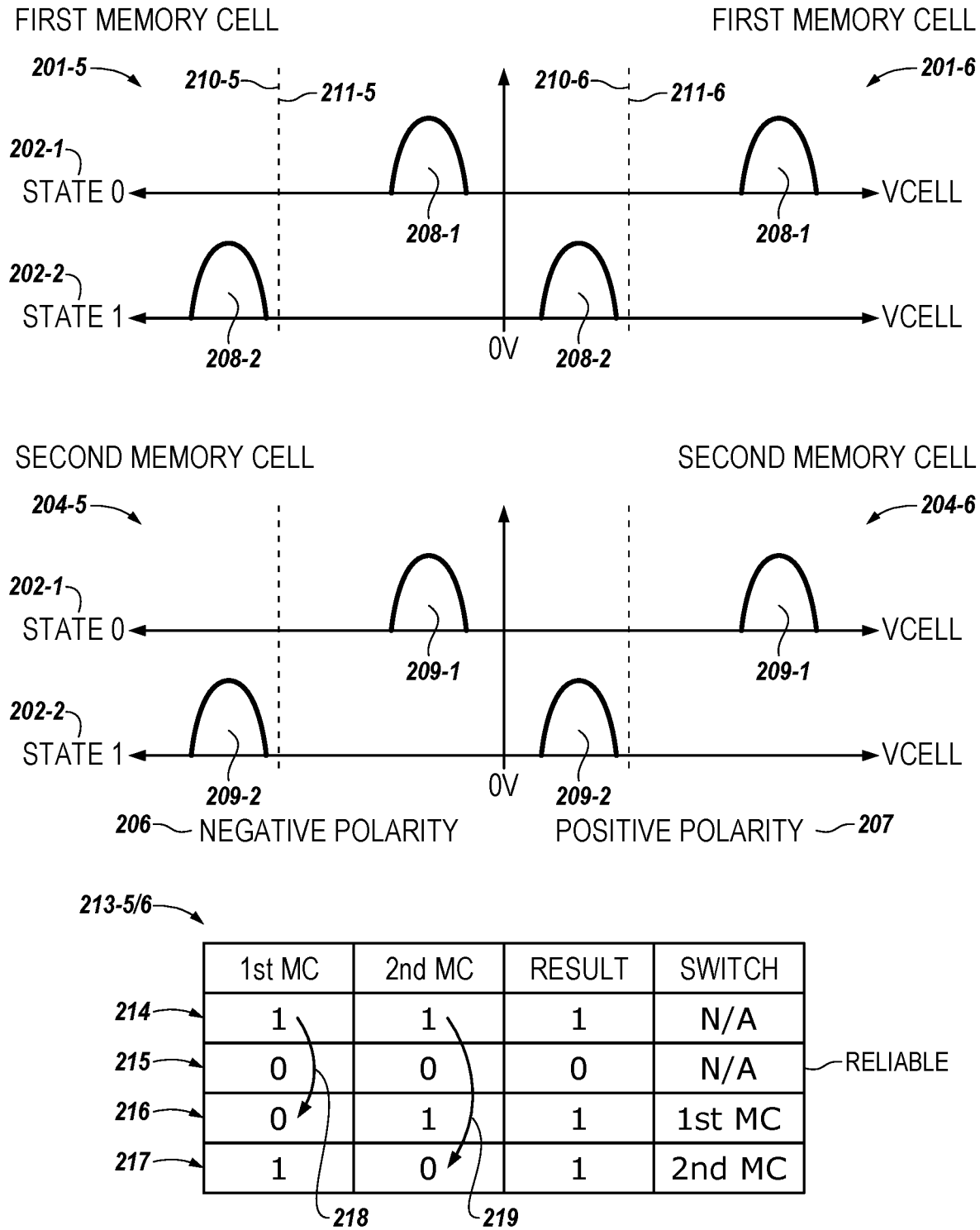
FIG. 2G is other such examples, in accordance with other embodiments of the present disclosure.

FIG. 2G illustrates another example of sensing threshold voltage distributions associated with memory states of memory cells for two memory cells being sensed to determine one data value, in accordance with another embodiment of the present disclosure. FIG. 2G illustrates an alternative embodiment consistent with FIGS. 2A and 2D-2F, except that FIG. 2G illustrates a first pair of memory cells 201-5 and 204-5, and associated threshold voltage distributions 208-1, 208-2, 209-1, and 209-2, for memory states 202-1 and 202-2 of a first memory cell 201-5 that may store its memory state as an intended data value corresponding to the one data value and a second memory cell 204-5 that also may store its memory state as the intended data value (e.g., as a reference) in a negative polarity 206. FIG. 2G also illustrates a second pair of memory cells 201-6 and 204-6, and associated threshold voltage distributions 208-1, 208-2, 209-1, and 209-2, for memory states 202-1 and 202-2 of a first memory cell 201-6 and a second memory cell 204-6 in a positive polarity 207. In a number of embodiments, memory cells 201-6 and 204-6 may be different memory cells in a different polarity implementation or may be the same as memory cells 201-5 and 204-5 in which the positive polarity 207 is applied rather than the negative polarity 206.

Accordingly, the left side of FIG. 2G illustrates programming the two memory cells 201-5 and 204-5 in the negative polarity 206 for a negative read using one of a pair of complementary memory states 202-1 and 202-2 for the first (intended) memory cell 201-5 and a same one of the pair of complementary memory states 202-1 and 202-2 for the second memory cell (reference) memory cell 204-5. As such, the first memory cell 201-5 may store the intended memory state and the second memory cell 204-5 may store the reference memory state to be compared to the intended memory state of the first memory cell to determine whether they properly store the same memory state (e.g., matched data values of 0 or matched data values of 1 in both of the paired memory cells).

A difference between the first memory state and the second memory state may be determined based on a difference in a magnitude of an absolute value of a voltage potentially stored by each of the two memory cells. For example, a memory cell 201-5, 204-5 that has a voltage value in a threshold voltage distribution 208-1, 209-1 with a lesser magnitude is in the first memory state 202-1 and a memory cell that has a voltage value in a threshold voltage distribution 208-2, 209-2 with a greater magnitude is in the second memory state 202-2. A first sensing voltage 210-5 may be selectably positioned at a lesser magnitude than, and marginal to, the threshold voltage distribution with the greater magnitude for both the first and second memory cells. The first sensing voltage 210-5 may be the only sense voltage used in this embodiment or a second sensing voltage 211-5 may be selectably positioned at substantially the same magnitude as or at a magnitude that is different from the first sensing voltage 210-5. For consistency, first sensing voltage 210-5 and/or the second sensing voltage 211-5 may be referred to as forming end(s) of, or being in, a sense window.

The left (negative polarity 206) side of Figure G illustrates using the first sensing voltage 210-5 to determine whether the first memory cell 201-5 to store the intended data value is in the first memory state 202-1 or in the second memory state 202-2 and also using the first sensing voltage 210-5 to determine whether the second memory cell 204-5 to store the reference data value is in the first memory state or in the second memory state. When a memory state of either the first memory cell 201-5 or the second memory cell 204-5 has shifted such that at least a portion of the threshold voltage distributions 208-1, 208-2, 209-1, and 209-2 overlaps the first sensing voltage 210-5, it may be determined that the first and second memory cells 201-5, 204-5 are in different memory states.

The first memory cell 201-5 storing the intended memory state as the first memory state 202-1 at the lesser magnitude and the second memory cell 204-5 also storing the reference memory state as the first memory state 202-1 at the lesser magnitude is readably reliable, as shown in row 215 of truth table 213-5. The greater reliability is based on the threshold voltage distributions 208-1, 209-1 for both the first memory cell (1st MC) 201-5 and the second memory cell (2nd MC) 201-5 with the lesser magnitude in the first memory state 202-1 being more separated from the first sensing voltage 210-5 than the threshold voltage distributions 208-2, 209-2 with the greater magnitude in the second memory state 202-2. Based on the greater reliability of the combination shown in row 215, a determination may be made that the inverse of the pair of readably reliable memory states, in which the first memory cell 201-5 stores the intended memory state as the second memory state, having a data value of 1, and the second memory cell 204-5 also stores the reference memory state as the second memory state at the greater magnitude, is less readably reliable, as shown in row 214 of truth table 213-5, by being more probable to have a memory cell switch memory states due to a shift in a threshold voltage distribution to at least partially overlap the marginal first sensing voltage 210-5.

The truth table 213-5 may be used to enable comparison of the less readably reliable second memory state 202-2 of the first memory cell 201-5 and the second memory cell 204-5 to a sensed memory state of the first memory cell that stores the intended memory state and a sensed memory state of the second memory cell that stores the reference memory state. The comparison may result in determining 218, as shown in row 216 of truth table 213-5, that the first memory cell 201-5 that stores the intended memory state is the memory cell that has switched from one memory state to another memory state based on a difference between the less readably reliable second memory state of the first memory cell (e.g., data value 1) and the sensed memory state of the first memory cell (e.g., data value 0). Alternatively, the comparison may result in determining 219, as shown in row 217 of truth table 213-5, that the second memory cell 204-5 that stores the reference memory state is the memory cell that has switched from one memory state to another memory state based on a difference between the less readably reliable second memory state of the second memory cell (e.g., data value 1) and the sensed memory state of the second memory cell (e.g., data value 0).

Moreover, the truth table 213-5 may be used to enable, responsive to determination of which of the two memory cells has switched their memory state, reprogramming the memory cell that has switched its memory state back to its complementary memory state. For example, as shown in FIG. 2G, the determination 218 that the data value of 1 for the first memory cell shown in row 214 has switched to a data value of 0 for the first memory cell shown in row 216 enables reprogramming of the first memory cell back to its original memory state of 1. In addition, the determination 219 that the data value of 1 for the second memory cell shown in row 214 has switched to a data value of 0 for the second memory cell shown in row 217 enables reprogramming of the second memory cell back to its original memory state of 1. Reprogramming the switched memory state of either the second memory cell or the first memory cell back to their original complementary memory states may enable determining the one data value as intended from the same memory states of the two memory cells, as indicated in the RESULT column of truth table 213-5.

The right side of FIG. 2G illustrates programming the two memory cells 201-6 and 204-6 in the positive polarity 207 for a positive read using one of a pair of complementary memory states 202-1 and 202-2 for the first (intended) memory cell 201-6 and a same one of the pair of complementary memory states 202-1 and 202-2 for the second memory cell (reference) memory cell 204-6. As such, the first memory cell 201-6 may store the intended memory state and the second memory cell 204-6 may store the reference memory state to be compared to the intended memory state of the first memory cell to determine whether they properly store the same memory state (e.g., matched data values of 0 or matched data values of 1 in both of the paired memory cells).

A difference between the first memory state and the second memory state may be determined based on a difference in a magnitude of an absolute value of a voltage potentially stored by each of the two memory cells. For example, a memory cell 201-6, 204-6 that has a voltage value in a threshold voltage distribution 208-1, 209-1 with a greater magnitude is in the first memory state 202-1 and a memory cell that has a voltage value in a threshold voltage distribution 208-2, 209-2 with a lesser magnitude is in the second memory state 202-2. A first sensing voltage 210-6 may be selectably positioned at a greater magnitude than, and marginal to, the threshold voltage distribution with the lesser magnitude for both the first and second memory cells. The first sensing voltage 210-6 may be the only sense voltage used in this embodiment or a second sensing voltage 211-6 may be selectably positioned at substantially the same magnitude as the first sensing voltage 210-6 or at a magnitude that is different from the first sensing voltage 210-6.

The right (positive polarity 207) side of FIG. 2G illustrates using the first sensing voltage 210-6 to determine whether the first memory cell 201-6 to store the intended data value is in the first memory state 202-1 or in the second memory state 202-2 and also using the first sensing voltage 210-6 to determine whether the second memory cell 204-6 to store the reference data value is in the first memory state or in the second memory state. When a memory state of either the first memory cell 201-6 or the second memory cell 204-6 has shifted such that at least a portion of the threshold voltage distributions 208-1, 208-2, 209-1, and 209-2 overlaps the first sensing voltage 210-6, it may be determined that the first and second memory cells 201-6, 204-6 are in different memory states.

The first memory cell 201-6 storing the intended memory state as the first memory state 202-1 at the greater magnitude and the second memory cell 204-6 also storing the reference memory state as the first memory state 202-1 at the greater magnitude is readably reliable, as shown in row 215 of truth table 213-6. The greater reliability is based on the threshold voltage distributions 208-1, 209-1 for both the first memory cell 201-6 and the second memory cell 204-6 with the greater magnitude in the first memory state 202-1 being more separated from the first sensing voltage 210-6 than the threshold voltage distributions 208-2, 209-2 with the lesser magnitude in the second memory state 202-2. Based on the greater reliability of the combination shown in row 215, a determination may be made that the inverse of the pair of readably reliable memory states, in which the first memory cell 201-6 stores the intended memory state as the second memory state, having a data value of 1, and the second memory cell 204-6 also stores the reference memory state as the second memory state at the lesser magnitude, is less readably reliable, as shown in row 214 of truth table 213-6, by being more probable to have a memory cell switch memory states due to a shift in a threshold voltage distribution to at least partially overlap the marginal first sensing voltage 210-6.

The truth table 213-6 may be configured to use comparison of the less readably reliable second memory state 202-2 of the first memory cell 201-6 and the second memory cell 204-6 to a sensed memory state of the first memory cell that stores the intended memory state and a sensed memory state of the second memory cell that stores the reference memory state. The comparison may result in determining 218, as shown in row 216 of truth table 213-6, that the first memory cell 201-6 that stores the intended memory state is the memory cell that has switched from one memory state to another memory state based on a difference between the less readably reliable second memory state of the first memory cell (e.g., data value 1) and the sensed memory state of the first memory cell (e.g., data value 0). Alternatively, the comparison may result in determining 219, as shown in row 217 of truth table 213-6, that the second memory cell 204-6 that stores the reference memory state is the memory cell that has switched from one memory state to another memory state based on a difference between the less readably reliable second memory state of the second memory cell (e.g., data value 1) and the sensed memory state of the second memory cell (e.g., data value 0).

Moreover, the truth table 213-6 may be used to enable, responsive to determination of which of the two memory cells has switched their memory state, reprogramming the memory cell that has switched its memory state back to its complementary memory state. For example, the determination 218 that the data value of 1 for the first memory cell shown in row 214 has switched to a data value of 0 for the first memory cell shown in row 216 enables reprogramming of the first memory cell back to its original memory state of 1. In addition, the determination 219 that the data value of 1 for the second memory cell shown in row 214 has switched to a data value of 0 for the second memory cell shown in row 217 enables reprogramming of the second memory cell back to its original memory state of 1. Reprogramming the switched memory state of either the second memory cell or the first memory cell back to their original complementary memory states may enable determining the one data value as intended from the same memory states of the two memory cells, as indicated in the RESULT column of truth table 213-6.

This disclosure describes, in a number of embodiments presented above, sensing memory states of each of two memory cells of a plurality of memory cells to determine one data value. The one data value may be determined by sensing the memory state of a first one of the two memory cells using a first sensing voltage in a sense window between a first threshold voltage distribution corresponding to a first memory state and a second threshold voltage distribution corresponding to a second memory state. Some embodiments may include sensing the memory state of a second one of the two memory cells using a second sensing voltage (e.g., at substantially the same or at a different magnitude) in the sense window. The first sensing voltage and/or the second sensing voltage may be selectably positioned closer in the sense window to the first threshold voltage distribution or the second threshold voltage distribution.

For example, as shown and described in connection with FIGS. 2A and 2D, sensing the memory states may include selecting the first sensing voltage and the second sensing voltage to have a negative polarity. The first sensing voltage may be positioned closer to the first threshold voltage distribution than to the second threshold voltage distribution and the second sensing voltage may be positioned closer to the second threshold voltage distribution than to the first threshold voltage distribution or vice versa. As shown and described in connection with FIGS. 2E and 2F, sensing the memory states may include selecting the first sensing voltage and the second sensing voltage to have a positive polarity. The first sensing voltage may be positioned closer to the first threshold voltage distribution than to the second threshold voltage distribution and the second sensing voltage may be positioned closer to the second threshold voltage distribution than to the first threshold voltage distribution or vice versa. As shown and described in connection with Figure G, sensing the memory states may include selecting the first sensing voltage and the second sensing voltage to both have either a negative polarity or a positive polarity of a same magnitude. Both the first sensing voltage and the second sensing voltage may be positioned closer to the first threshold voltage distribution than to the second threshold voltage distribution or vice versa.

Figure 3:
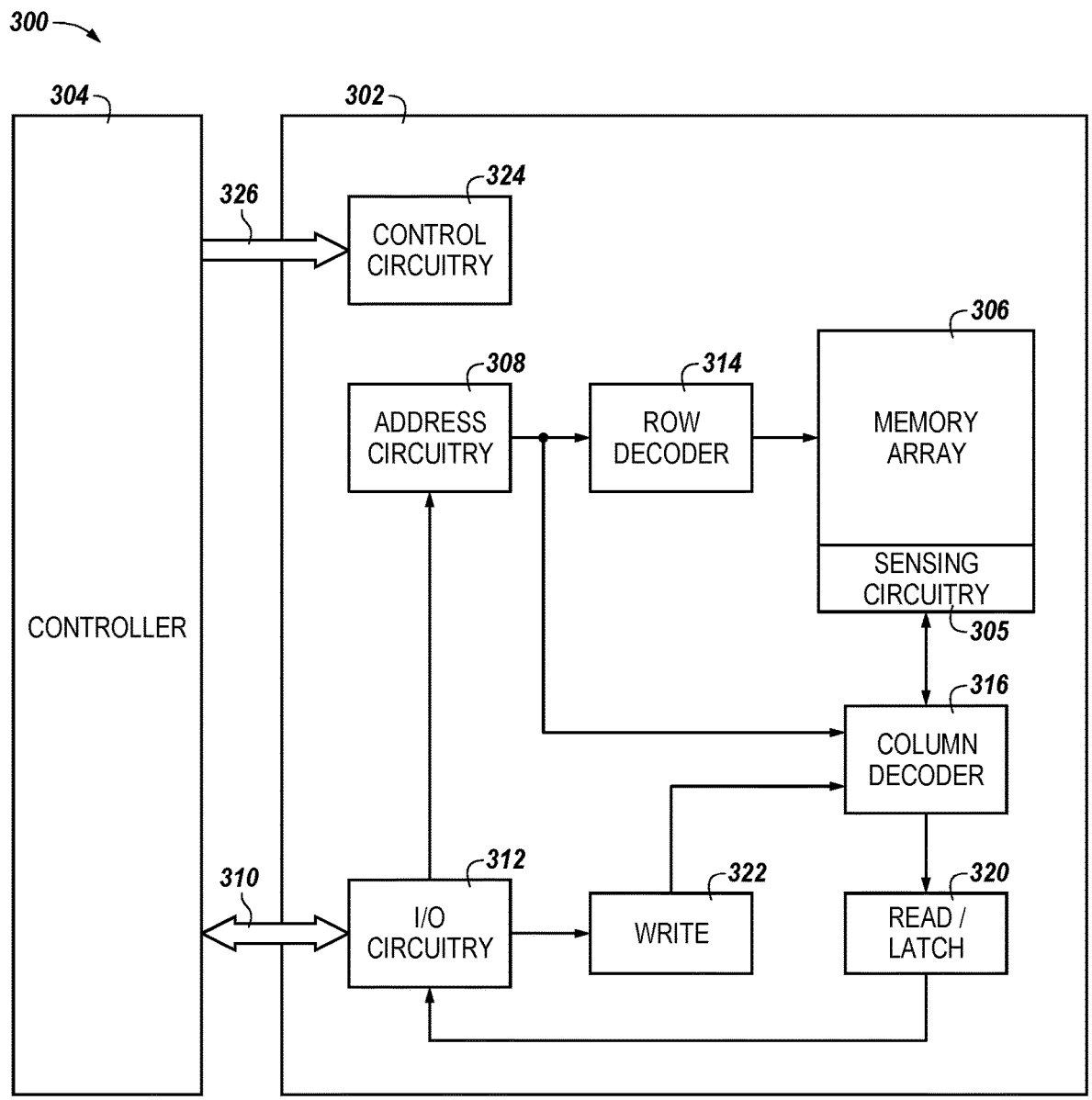
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers.

Memory device 302 may sense (e.g., read) data in memory array 306 by sensing voltage and/or current changes in the memory array columns using sense/buffer circuitry that in some examples may be read/latch circuitry 320. Read/latch circuitry 320 may read and latch data from the memory array 306. Sensing circuitry 305 may include a number of sense amplifiers coupled to memory cells of memory array 306, which may operate in combination with the read/latch circuitry 320 to sense (read) memory states from targeted memory cells. I/O circuitry 312 may be included for bi-directional data communication over the I/O connections 310 with controller 304. Write circuitry 322 may be included to write data to memory array 306.

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, controller 304 may be configured to cause memory device 302 to at least perform the methods disclosed herein, such as two memory cells being sensed to determine one data value. In some examples, memory device 302 may include the circuitry previously described in conjunction with FIGS. 1 and 2A-2G. For example, memory device 302 may include circuitry such as the sense amplifiers, the latches, the truth tables, the word and bit lines, and/or the paired memory cells, among other circuitry disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 300 of FIG. 3 has been simplified. It should be recognized that the functionality of the various block components described with reference to FIG. 3 may not necessarily be segregated to distinct components or component portions of an integrated circuit device. For example, a single component or component portion of an integrated circuit device could be adapted to perform the functionality of more than one block component of FIG. 3. Alternatively, one or more components or component portions of an integrated circuit device could be combined to perform the functionality of a single block component of FIG. 3.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory having a plurality of memory cells; and
   circuitry configured to sense memory states of each of two memory cells of the plurality of memory cells to determine one data value, wherein each of the two memory cells is a self-selecting memory cell in which a single material serves as a select element and a storage element, by:
   sensing a memory state of a first one of the two memory cells using a first sensing voltage in a sense window between a first threshold voltage distribution corresponding to a first memory state and a second threshold voltage distribution corresponding to a second memory state; and
   sensing a memory state of a second one of the two memory cells using a second sensing voltage in the sense window;
   wherein the first sensing voltage and the second sensing voltage are selectably closer in the sense window to the first threshold voltage distribution or the second threshold voltage distribution.

2. The apparatus of claim 1, wherein the circuitry is further configured to program the one data value by:
- applying a first voltage pulse to the first memory cell, wherein the first memory cell stores its memory state as an intended data value corresponding to the one data value; and
- applying a second voltage pulse to the second memory cell, wherein the second memory cell stores its memory state as a reference data value corresponding to the intended data value.

3. The apparatus of claim 1, wherein the first sensing voltage and the second sensing voltage are selectably closer in the sense window to different ones of the first threshold voltage distribution and the second sensing voltage.

4. The apparatus of claim 1, wherein the circuitry is configured to further determine the one data value by:
- comparing the sensed memory states of each of the two memory cells;
- validating the memory state of the first memory cell as an intended data value corresponding to the one data value by determining that the sensed memory states are complementary binary memory states; and
- determining a switch in the memory state of the two memory cells by determining that the sensed memory states match binary memory states.

5. The apparatus of claim 1, wherein the sensed memory states include a memory state associated with the first threshold voltage distribution of a first subset of the plurality of memory cells whose relative magnitude is greater for a particular polarity than a different one of the two memory states associated with the second threshold voltage distribution of a second subset of the plurality of memory cells.

6. The apparatus of claim 1, wherein the circuitry is further configured to:
- store the memory state of the first memory cell in association with a particular end of the sense window having a particular magnitude of a polarity; and
- store the memory state of the second memory cell in association with an opposite end of the sense window having a different magnitude of the polarity;
- wherein the polarity is selectable from a positive polarity and a negative polarity.

7. The apparatus of claim 1, wherein each of the two memory cells is a resistance variable memory cell configured to selectably store either of the first and second states.

8. The apparatus of claim 1, wherein the single material is a chalcogenide material.

9. An apparatus, comprising:
- circuitry in a memory device, the circuitry configured to:
  - sense memory states of each of two memory cells of a plurality of memory cells to determine one data value, wherein each of the two memory cells is a self-selecting memory cell in which a single material serves as a select element and a storage element, by:
    - sensing a memory state of a first one of the two memory cells using a first sensing voltage in a sense window between a first threshold voltage distribution corresponding to a first memory state and a second threshold voltage distribution corresponding to a second memory state;
    - sensing a memory state of a second one of the two memory cells using a second sensing voltage in the sense window; and
    - determining which of the two memory cells has switched their memory state due to a shift in the first threshold voltage distribution relative to a magnitude of the first sensing voltage in the sense window;
  - wherein the magnitude of the first sensing voltage is selectably closer to the first threshold voltage distribution than to the second threshold voltage distribution in the sense window.

10. The apparatus of claim 9, wherein the switch in the memory state is due to a shift in the second threshold voltage distribution relative to a magnitude of the second sensing voltage in the sense window.

11. The apparatus of claim 9, wherein:
- one end of the sense window corresponds to a programmed memory state for a first memory cell and another end of the polarity of the sense window corresponds to a complementary reprogrammed memory state for the first memory cell; and
- which end of the sense window corresponds to the programmed memory state and which other end of the sense window corresponds to the complementary reprogrammed memory state is determined by:
  - a first number of voltage pulses applied to the first memory cell to program the first memory cell to a magnitude less than the first sensing voltage in the sense window; and
  - a second number, different from the first number, of voltage pulses applied to the first memory cell to program the first memory cell to a magnitude greater than the second sensing voltage in the sense window.

12. The apparatus of claim 9, wherein:
- one end of the sense window corresponds to a programmed memory state for a first memory cell and another end of the polarity of the sense window corresponds to a complementary reprogrammed memory state for a second memory cell; and
- which end of the sense window corresponds to the programmed memory state and which other end of the sense window corresponds to the complementary reprogrammed memory state is determined by:
  - a first number of voltage pulses applied to the first memory cell to program the first memory cell to a magnitude less than the first sensing voltage in the sense window; and
  - a second number, different from the first number, of voltage pulses applied to the second memory cell to program the second memory cell to a magnitude greater than the second sensing voltage in the sense window.

13. The apparatus of claim 9, wherein:
- the circuitry is associated with a truth table used to enable:
  - comparison of the sensed memory state of the first memory cell to the sensed memory state of the second memory cell in binary memory states;
  - determination of the switch in the memory state due to the shift by determination that the sensed memory states match; and
  - determination of which of the two memory cells has switched from one memory state to another memory state.

14. The apparatus of claim 13, wherein, responsive to the determination of which of the two memory cells has switched from the one memory state to the other memory state, the circuitry is configured to reprogram the memory cell that has switched back to the one memory state to enable determination, as intended, of the one data value from the memory states of the two memory cells.

15. The apparatus of claim 13, wherein:
the determination of which of the two memory cells has switched from one memory state to another memory state is based at least in part on:
one combination of the two memory states that is complementary in binary memory states being more readably reliable than a complementary other combination of the two memory states due to a magnitude of separation of at least one sensing voltage from a threshold voltage distribution of either the first memory state or the second memory state being greater than a separation of the at least one sensing voltage from a threshold voltage distribution of the other memory state; and
the one combination is more readably reliable based on the greater magnitude of the separation, thereby having a corresponding greater shift to reach the sensing voltage being less probable than a shift resulting from a lesser separation in the other combination.

16. A method of operating memory, comprising:
sensing memory states of each of two memory cells of a plurality of memory cells to determine one data value, wherein each of the two memory cells is a self-selecting memory cell in which a single material serves as a select element and a storage element, by:
sensing a memory state of a first one of the two memory cells using a first sensing voltage in a sense window between a first threshold voltage distribution corresponding to a first memory state and a second threshold voltage distribution corresponding to a second memory state;
sensing a memory state of a second one of the two memory cells using a second sensing voltage in the sense window; and
selectably positioning the first sensing voltage and the second sensing voltage closer in the sense window to the first threshold voltage distribution or the second threshold voltage distribution.

17. The method of claim 16, further comprising:
selecting the first sensing voltage and the second sensing voltage to have a negative polarity; and
either positioning the first sensing voltage closer to the first threshold voltage distribution than to the second threshold voltage distribution and positioning the second sensing voltage closer to the second threshold voltage distribution than to the first threshold voltage distribution or vice versa.

18. The method of claim 16, further comprising:
selecting the first sensing voltage and the second sensing voltage to have a positive polarity; and
either positioning the first sensing voltage closer to the first threshold voltage distribution than to the second threshold voltage distribution and positioning the second sensing voltage closer to the second threshold voltage distribution than to the first threshold voltage distribution or vice versa.

19. The method of claim 16, further comprising:
selecting the first sensing voltage and the second sensing voltage to both have either a negative polarity or a positive polarity of a same magnitude; and
either positioning both the first sensing voltage and the second sensing voltage closer to the first threshold voltage distribution than to the second threshold voltage distribution or vice versa.

20. A method of operating memory, comprising:
sensing memory states of each of two memory cells to determine one data value by:
sensing a memory state of a first one of the two memory cells using a first sensing voltage in a sense window between a first threshold voltage distribution corresponding to a first memory state and a second threshold voltage distribution corresponding to a second memory state;
sensing a memory state of a second one of the two memory cells using a second sensing voltage in the sense window; and
selecting a magnitude of the first sensing voltage in the sense window to be closer to a first magnitude determined to correspond to a first margin of the first threshold voltage distribution than to a second magnitude determined to correspond to a second margin of the second threshold voltage distribution.

21. The method of claim 20, further comprising:
responsive to determination of which of the two memory cells has switched their memory state, reprogramming the memory cell that has switched its memory state back to its complementary memory state; and
determining the one data value as intended from complementary memory states of the two memory cells.

22. The method of claim 20, further comprising:
programming the two memory cells in a negative polarity for a negative read using one of a pair of complementary memory states for the first memory cell and another of the pair for the second memory cell;
designating the first memory cell to store a reference memory state;
designating the second memory cell to store an intended memory state to be compared to the reference memory state of the first memory cell;
determining a difference between the first memory state and the second memory state based on a difference in a magnitude of an absolute value of a voltage stored by each of the two memory cells, wherein a memory cell that has a voltage value in a threshold voltage distribution with a lesser magnitude is in the first memory state and a memory cell that has a voltage value in a threshold voltage distribution with a greater magnitude is in the second memory state;
selectably positioning the first sensing voltage in the sense window at a greater magnitude than, and marginal to, the threshold voltage distribution with the lesser magnitude; and
selectably positioning a second sensing voltage in the sense window at a lesser magnitude than, and marginal to, the threshold voltage distribution with the greater magnitude.

23. The method of claim 20, further comprising:
programming the two memory cells in a positive polarity for a positive read using one of a pair of complementary memory states for the first memory cell and another of the pair for the second memory cell;
designating the first memory cell to store an intended memory state;
designating the second memory cell to store a reference memory state to be compared to the intended memory state of the first memory cell;
determining a difference between the first memory state and the second memory state based on a difference in a magnitude of an absolute value of a voltage stored by each of the two memory cells, wherein a memory cell that has a voltage value in a threshold voltage distribution with a greater magnitude is in the first memory state and a memory cell that has a voltage value in a threshold voltage distribution with a lesser magnitude is in the second memory state;
selectably positioning the first sensing voltage in the sense window at a greater magnitude than, and marginal to, the threshold voltage distribution with the lesser magnitude; and
selectably positioning a second sensing voltage in the sense window at a lesser magnitude than, and marginal to, the threshold voltage distribution with the greater magnitude.

24. The method of claim 20, further comprising:
programming the two memory cells in a negative polarity for a negative read using one of a pair of complementary memory states for the first memory cell and a same one of the pair for the second memory cell;
designating the first memory cell to store an intended memory state;
designating the second memory cell to store a reference memory state to be compared to the intended memory state of the first memory cell;
determining a difference between the first memory state and the second memory state based on a difference in a magnitude of an absolute value of a voltage potentially stored by each of the two memory cells, wherein a memory cell that has a voltage value in a threshold voltage distribution with a lesser magnitude is in the first memory state and a memory cell that has a voltage value in a threshold voltage distribution with a greater magnitude is in the second memory state; and
selectably positioning the first sensing voltage at a lesser magnitude than, and marginal to, the threshold voltage distribution with the greater magnitude for both the first and second memory cells.

25. The method of claim 20, further comprising:
programming the two memory cells in a positive polarity for a positive read using one of a pair of complementary memory states for the first memory cell and a same one of the pair for the second memory cell;
designating the first memory cell to store an intended memory state;
designating the second memory cell to store a reference memory state to be compared to the intended memory state of the first memory cell;
determining a difference between the first memory state and the second memory state based on a difference in a magnitude of an absolute value of a voltage potentially stored by each of the two memory cells,
wherein a memory cell that has a voltage value in a threshold voltage distribution with a greater magnitude is in the first memory state and a memory cell that has a voltage value in a threshold voltage distribution with a lesser magnitude is in the second memory state; and
selectably positioning the first sensing voltage at a greater magnitude than, and marginal to, the threshold voltage distribution with the lesser magnitude for both the first and second memory cells.

\* \* \* \* \*